United States Patent
Matsumoto

(10) Patent No.: US 6,657,478 B2
(45) Date of Patent: Dec. 2, 2003

(54) VOLTAGE GENERATION CIRCUIT AND DISPLAY UNIT COMPRISING VOLTAGE GENERATION CIRCUIT

(75) Inventor: Shoichiro Matsumoto, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/274,980

(22) Filed: Oct. 22, 2002

(65) Prior Publication Data

US 2003/0034828 A1 Feb. 20, 2003

Related U.S. Application Data

(62) Division of application No. 09/745,995, filed on Dec. 26, 2000, now Pat. No. 6,498,527.

(30) Foreign Application Priority Data

Dec. 27, 1999 (JP) .......................... 11-371632

(51) Int. Cl.[7] .................................. G05F 3/02
(52) U.S. Cl. ................... 327/536; 327/537; 345/84; 345/100
(58) Field of Search ................. 327/534, 536, 327/537; 345/84, 94, 100

(56) References Cited

U.S. PATENT DOCUMENTS

| | | | | |
|---|---|---|---|---|
| 5,126,590 A | * | 6/1992 | Chern | 327/536 |
| 5,313,107 A | | 5/1994 | Itoh | 327/536 |
| 5,406,523 A | * | 4/1995 | Foss et al. | 365/226 |
| 5,592,115 A | * | 1/1997 | Kassapian | 327/239 |
| 5,661,683 A | | 8/1997 | Song | 365/185.18 |
| 5,757,349 A | | 5/1998 | Togashi | 345/91 |
| 5,815,133 A | * | 9/1998 | Tsuboyama et al. | 345/95 |
| 5,844,535 A | * | 12/1998 | Itoh et al. | 345/92 |
| 5,889,428 A | * | 3/1999 | Young | 327/536 |
| 5,952,990 A | | 9/1999 | Inoue et al. | 345/97 |
| 5,986,649 A | * | 11/1999 | Yamazaki | 345/211 |
| 6,010,926 A | | 1/2000 | Rho et al. | 438/199 |
| 6,107,864 A | | 8/2000 | Fukushima et al. | 327/536 |
| 6,242,291 B1 | | 6/2001 | Kusumoto et al. | 438/158 |
| 6,248,619 B1 | | 6/2001 | Lee et al. | 438/200 |
| 6,271,818 B1 | | 8/2001 | Yamazaki et al. | 257/59 |
| 6,297,862 B1 | * | 10/2001 | Murade | 349/44 |

* cited by examiner

Primary Examiner—Terry D. Cunningham
(74) Attorney, Agent, or Firm—Armstrong, Westerman & Hattori, LLP

(57) ABSTRACT

A voltage generation circuit including a capacitor, an n-channel MOS transistor, a p-channel MOS transistor and the like. The n-channel transistor has a source terminal connected to a node and a drain terminal employed as an output terminal for a negative voltage, the p-channel MOS transistor has a source terminal connected to the aforementioned node and a drain terminal employed as a ground terminal, gate terminals of the n-channel MOS transistor and the p-channel transistor are connected in common, and clock signals inverted in phase to each other are applied to the common node and a first terminal of the capacitor.

9 Claims, 28 Drawing Sheets

■ GATE(Cr)
[p] p-TYPE SILICON THIN FILM
[n] n-TYPE SILICON THIN FILM

PUMP CAPACITY DEPENDENCY OF DRIVING CURRENT

F I G. 1 4
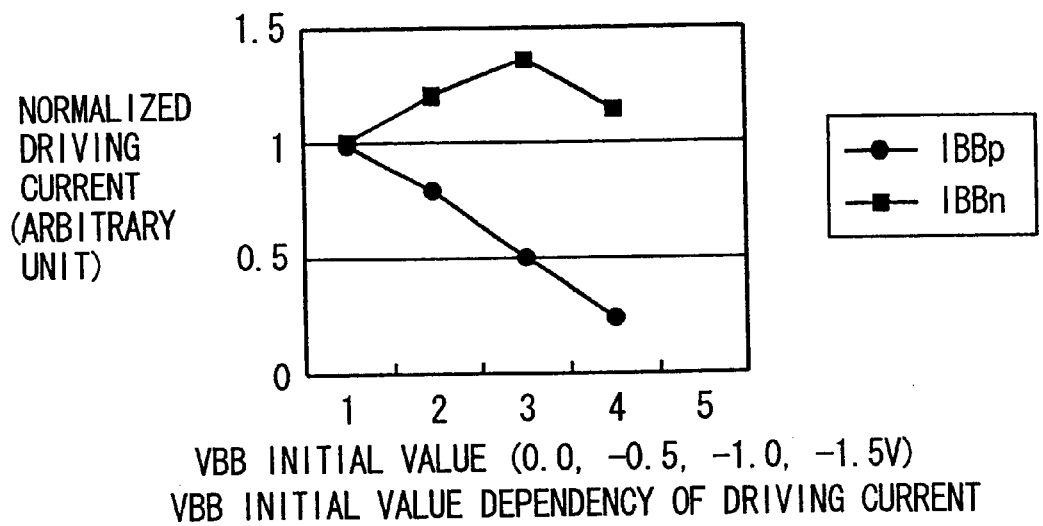
F I G. 1 5
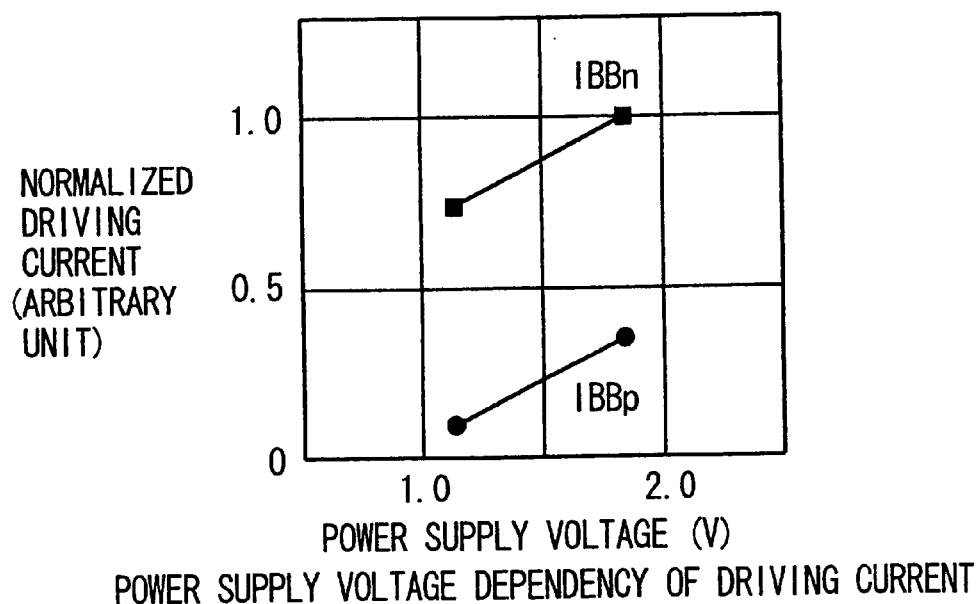

F I G. 1 7
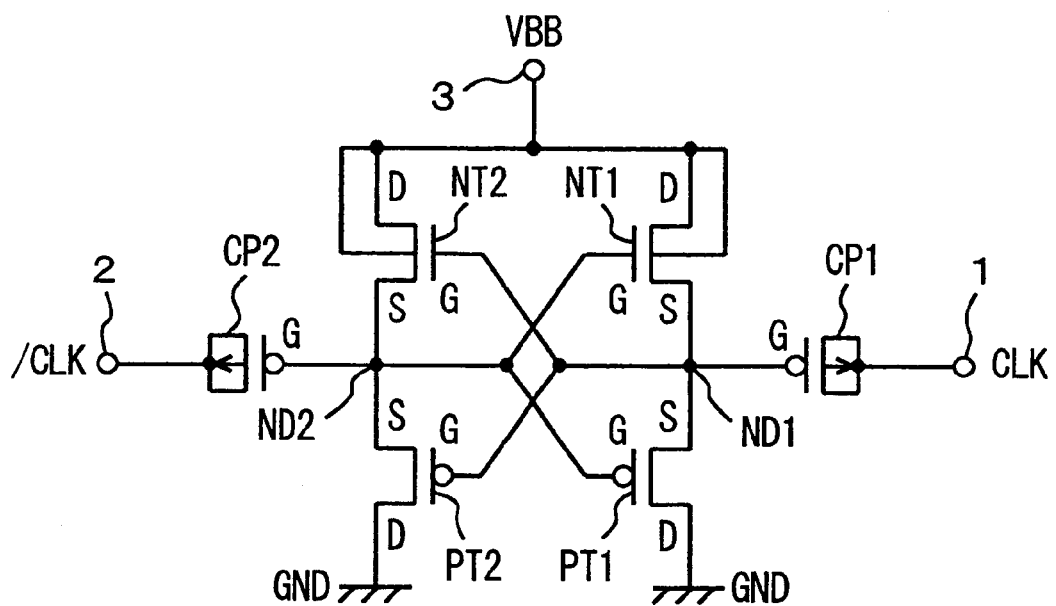

F I G. 1 9
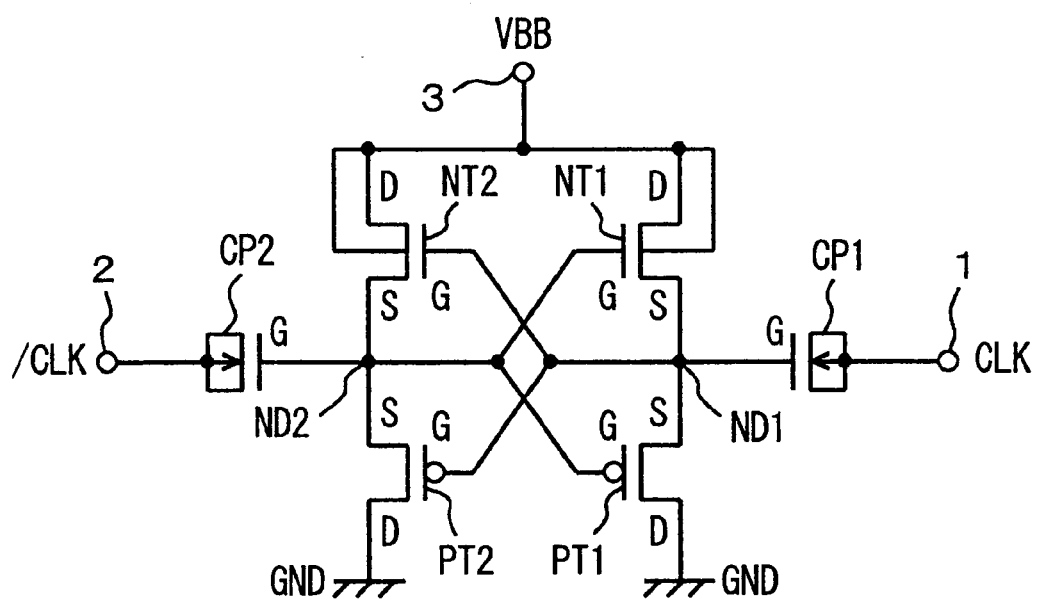

Tr SIZE DEPENDENCY OF DRIVING CURRENT

VBB INITIAL VALUE DEPENDENCY OF DRIVING CURRENT

VOLTAGE GENERATION CIRCUIT AND DISPLAY UNIT COMPRISING VOLTAGE GENERATION CIRCUIT

This application is a Divisional of prior application Ser. No. 09/745,995 filed Dec. 26, 2000 now U.S. Pat. No. 6,498,527.

BACKGROUND OF THE INVENTION

1. Field of the Intention

The present invention relates to a voltage generation circuit employing a capacitor and a display unit comprising this voltage generation circuit.

2. Description of the Related Art

FIG. 41 illustrates an exemplary conventional voltage generation circuit employing a capacitor. The voltage generation circuit shown in FIG. 41 comprises a capacitor (pumping capacitor) cp1, first and second p-channel MOS (metal oxide semiconductor) transistors pt1 and pt2, an inverter circuit inv1 and the like.

The first p-channel MOS transistor (driving transistor) pt1 has a drain terminal D and a gate terminal G connected to a node nd1 and a source terminal S defining a voltage output terminal 30 outputting a negative voltage VBB. The second p-channel transistor pt2 has a source terminal S connected to the node nd1, a gate terminal G connected to the inverter circuit inv1, and a drain terminal D defining a ground terminal.

The capacitor cp1 is formed by a p-channel transistor having a source terminal and a drain terminal connected in common with each other and a gate terminal G connected to the node nd1. A clock signal CLK is input in the capacitor cp1 and the inverter circuit inv1 through an input terminal 10.

The outline of operation of the voltage generation circuit having the aforementioned structure for generating the voltage (negative voltage) VBB is now described.

When the clock signal CLK goes low in logic (hereinafter simply referred to as "low"), the potential Vn1 of the node nd1 lowers to reach a negative voltage. When the potential Vn1 of the node nd1 lowers below the potential VBB of the source terminal S of the first p-channel MOS transistor pt1 in excess of the threshold voltage Vthp1 of the first p-channel MOS transistor pt1, the first p-channel transistor pt1 is turned on.

At this time, charges proportional to the capacitance of the capacitor cp1 flow from the source terminal S of the first p-channel MOS transistor pt1 toward the node nd1. These charges are stored in the capacitor cp1 since the second p-channel MOS transistor pt2 is in an OFF state, and the potential Vn1 of the node nd1 rises in response to these charges.

When the clock signal CLK goes high in logic (hereinafter simply referred to as "high"), the potential Vn1 of the node nd1 is pulled up by a level corresponding to the high level (VDD) of the clock signal CLK, to further rise.

When the clock signal CLK goes high, further, a low-level signal is input in the second p-channel MOS transistor pt2 through the inverter circuit inv1, to turn on the second p-channel MOS transistor pt2. At this time, the charges stored in the capacitor cp1 are extracted to the ground terminal (GND), and the potential Vn1 of the node nd1 lowers.

Thus, the charges are pumped from the source terminal S of the first p-channel MOS transistor pt1 to the ground terminal (GND) every cycle of the clock signal CLK, thereby rendering the voltage of the source terminal S of the first p-channel MOS transistor pt1 negative.

FIG. 42 shows a voltage generation circuit known as an example improving the pumping efficiency of the aforementioned conventional voltage generation circuit. This voltage generation circuit uses two conventional voltage generation circuits described above, and applies clock signals CLK and /CLK inverted in phase to each other to terminals of pumping capacitors cp1 and cp2 respectively thereby improving the pumping efficiency thereof and reducing the time for attaining a prescribed negative voltage.

While the aforementioned conventional voltage generation circuit effectively generates the voltage (negative voltage) VBB with a simple structure, the theoretical value of the achieved negative voltage (VBB) is (−VDD+Vthp1+Vthp2) in FIG. 41 and (−VDD+Vthp1) in FIG. 42, which is less than the maximum logical value (−VDD) by the threshold voltage (Vthp1, Vthp2) of the first and second p-channel MOS transistors pt1 and pt2.

As the output negative voltage VBB lowers, further, the potential difference between the source terminal S of the first p-channel MOS transistor pt1 and the node nd1, i.e., the gate-to-source voltage of the first p-channel MOS transistor pt1 reduces to lower the drivability of the first p-channel MOS transistor pt1.

In recent years, a voltage generation circuit having high current drivability is required in view of current drivability necessary for controlling word lines of a DRAM (dynamic random access memory) with a negative bias or in view of reduction in power consumption and attainment of operating margins of pixel transistors in a liquid crystal display unit or the like. However, the aforementioned conventional voltage generation circuit cannot sufficiently satisfy such requirements due to the low current drivability.

SUMMARY OF THE INVENTION

An object of the present invention is to provide a voltage generation circuit capable of obtaining a high voltage with high current drivability and a display unit comprising this voltage generator.

A voltage generation circuit according to an aspect of the present invention has a capacitor and generates a prescribed voltage through a node connected to a first terminal of the capacitor, and further comprises an n-channel transistor having one of a source terminal and a drain terminal connected to the node with the other one of the source terminal and the drain terminal defining an output terminal outputting the prescribed voltage and a p-channel transistor having one of a source terminal and a drain terminal connected to the node with the other one of the source terminal and the drain terminal defining a reference potential terminal, while gate terminals of the n-channel transistor and the p-channel transistor are connected in common, one of two clock signals inverted in phase to each other is applied to a second terminal of the capacitor, and the other one of the two clock signals is applied to the gate terminals connected in common.

The voltage generation circuit can obtain an output voltage not influenced by the threshold voltage Vth of the n-channel transistor serving as a driving transistor. When generating a negative voltage, for example, the driving transistor is reliably turned on also when the output negative voltage lowers, whereby the drivability of the driving transistor can be sufficiently secured regardless of the value of the negative voltage. Further, the n-channel transistor is employed as the driving transistor, whereby the operating speed of the voltage generation circuit can be increased as compared with the case of employing the p-channel transistor, and the drivability can be increased. When securing ability equivalent to that of the p-channel transistor with the n-channel transistor, further, the element areas of the transistors can be reduced.

The voltage generation circuit is preferably formed on a P-type semiconductor substrate having a triple well structure, the n-channel transistor preferably includes a MOSFET formed on a P-type well to which the output terminal is connected for obtaining its back gate potential, the p-channel transistor preferably includes a MOSFET formed on an N-type well to which a positive potential is applied for obtaining its back gate potential, and the capacitor preferably includes an n-channel transistor separately formed on a P-type well with a source terminal and a drain terminal connected in common and a gate terminal connected to the node.

The voltage generation circuit may be formed on an N-type semiconductor substrate having a double well structure, the n-channel transistor may include a MOSFET formed on a P-type well to which the output terminal is connected for obtaining its back gate potential, the p-channel transistor may include a MOSFET formed on an N-type well to which a positive potential is applied for obtaining its back gate potential, and the capacitor may include an n-channel transistor separately formed on a P-type well with a source terminal and a drain terminal connected in common and a gate terminal connected to the node.

The voltage generation circuit may be formed on a glass substrate, an active layer of each of the n-channel transistor and the p-channel transistor may be formed from a semiconductor layer formed on the glass substrate, and at least one electrode of the capacitor may be formed from an n-type region or a p-type region formed on part of the semiconductor layer.

The voltage generation circuit preferably further comprises an inverter circuit for forming the two clock signals on the basis of a single clock signal.

In this case, the two clock signals can be formed from the single clock signal, whereby the structure of an external circuit can be simplified as compared with the case of employing the two clock signals from the first. Further, the voltage can be effectively generated due to a delay effect through the inverter circuit.

The two clock signals preferably have a period when both of the two clock signals go low in logic in phase inversion.

In this case, the two clock signals have the period when both of the same go low in logic, whereby the potential of the node can be set to a positive voltage after reliably turning off the driving transistor, for example, for effectively generating the negative voltage.

The voltage generation circuit may further comprise a logic circuit for forming the two clock signals on the basis of a single clock signal, and a delay circuit adjusting a period so that the two clock signals have a period when both of the two clock signals go low in logic in phase inversion.

In this case, a pair of clock signals having the period when both of the two clock signals go low in logic in phase inversion can be readily and automatically produced on the basis of the single clock signal.

A voltage generation circuit according to another aspect of the present invention has first and second capacitors and generates a prescribed voltage through first and second nodes connected to first terminals of the first and second capacitors respectively, and further comprises a first n-channel transistor having one of a source terminal and a drain terminal connected to the first node with the other one of the source terminal and the drain terminal defining an output terminal outputting the prescribed voltage, a second n-channel transistor having one of a source terminal and a drain terminal connected to the second node with the other one of the source terminal and the drain terminal defining an output terminal outputting the prescribed voltage, a first p-channel transistor having one of a source terminal and a drain terminal connected to the first node with the other one of the source terminal and the drain terminal defining a reference potential terminal, and a second p-channel transistor having one of a source terminal and a drain terminal connected to the second node with the other one of the source terminal and the drain terminal defining a reference potential terminal, while a gate terminal of the first n-channel transistor and a gate terminal of the first p-channel transistor are connected in common and connected to the second node, a gate terminal of the second n-channel transistor and the gate terminal of second p-channel transistor are connected in common and connected to the first node, the output terminals of the first and second n-channel transistors are connected in common, one of two clock signals inverted in phase to each other is applied to a second terminal of the first capacitor, and the other one of the two clock signals is applied to a second terminal of the second capacitor.

The voltage generation circuit can obtain an output voltage not influenced by the threshold voltage Vth of the first and second n-channel transistors serving as driving transistors. When generating a negative voltage, for example, the driving transistors are reliably turned on also when the output negative voltage lowers, whereby the drivability of the driving transistors can be sufficiently secured regardless of the value of the negative voltage. Further, the n-channel transistors are employed as the driving transistors, whereby the operating speed of the voltage generation circuit can be increased as compared with the case of employing the p-channel transistors, and the drivability can be increased. When securing ability equivalent to that of the p-channel transistors with the n-channel transistors, further, the element areas of the transistors can be reduced.

In addition, pumping operation is performed every half cycle of the clock signals, whereby pumping can be more efficiently performed for increasing the speed for reaching the target output voltage.

The voltage generation circuit is preferably formed on a P-type semiconductor substrate having a triple well structure, each of the first and second n-channel transistors preferably includes a MOSFET formed on a P-type well to which the output terminal is connected for obtaining its back gate potential, each of the first and second p-channel transistors preferably includes a MOSFET formed on an N-type well to which the clock signal is applied for obtaining its back gate potential, the first capacitor preferably includes a p-channel transistor separately formed on an N-type well with a source terminal and a drain terminal connected in common and a gate terminal connected to the first node, and the second capacitor preferably includes a p-channel transistor separately formed on an N-type well with a source terminal and a drain terminal connected in common and a gate terminal connected to the second node.

The voltage generation circuit may be formed on a P-type semiconductor substrate having a triple well structure, each of the first and second n-channel transistors may include a MOSFET formed on a P-type well to which the output terminal is connected for obtaining its back gate potential, each of the first and second p-channel transistors may include a MOSFET formed on an N-type well to which a positive potential is applied for obtaining its back gate potential, the first capacitor may include a p-channel transistor separately formed on an N-type well with a source terminal and a drain terminal connected in common and a gate terminal connected to the first node, and the second capacitor may include a p-channel transistor separately formed on an N-type well with a source terminal and a drain terminal connected in common and a gate terminal connected to the second node.

The voltage generation circuit may be formed on a P-type semiconductor substrate having a triple well structure, each of the first and second n-channel transistors may include a MOSFET formed on a P-type well to which the output terminal is connected for obtaining its back gate potential, each of the first and second p-channel transistors may include a MOSFET formed on an N-type well to which a positive potential is applied for obtaining its back gate potential, the first capacitor may include an n-channel transistor separately formed on a P-type well with a source terminal and a drain terminal connected in common and a gate terminal connected to the first node, and the second capacitor may include an n-channel transistor separately formed on a P-type well with a source terminal and a drain terminal connected in common and a gate terminal connected to the second node.

The voltage generation circuit may be formed on a P-type semiconductor substrate having a double well structure, each of the first and second n-channel transistors may include a MOSFET formed on a P-type well to which the output terminal is connected for obtaining its back gate potential, each of the first and second p-channel transistors may include a MOSFET formed on an N-type well to which a positive potential is applied for obtaining its back gate potential, the first capacitor may include an n-channel transistor separately formed on a P-type well with a source terminal and a drain terminal connected in common and a gate terminal connected to the first node, and the second capacitor may include an n-channel transistor separately formed on a P-type well with a source terminal and a drain terminal connected in common and a gate terminal connected to the second node.

The voltage generation circuit may be formed on an insulator film formed on a silicon substrate, an active layer of each of the first and second n-channel transistors and the first and second p-channel transistors may be formed from a semiconductor layer formed on the insulator film, and at least one electrode of each of the first and second capacitors is formed from an n-type region or a p-type region formed on part of the semiconductor layer.

The voltage generation circuit may be formed on a glass substrate, an active layer of each of the first and second n-channel transistors and the first and second p-channel transistors may be formed from a semiconductor layer formed on the glass substrate, and at least one electrode of each of the first and second capacitors may be formed from an n-type region or a p-type region formed on part of the semiconductor layer.

The voltage generation circuit preferably further comprises an inverter circuit for forming the two clock signals on the basis of a single clock signal.

In this case, the two clock signals can be formed from the single clock signal, whereby the structure of an external circuit can be simplified as compared with the case of employing the two clock signals from the first. Further, the voltage can be effectively generated due to a delay effect through the inverter circuit.

The two clock signals preferably have a period when both of the two clock signals go low in logic in phase inversion.

In this case, the two clock signals have the period when both of the two clock signals go low in logic, whereby the potential of the node can be set to a positive voltage after reliably turning off the driving transistors, for example, for effectively generating the negative voltage.

The voltage generation circuit may further comprise a logic circuit for forming the two clock signals on the basis of a single clock signal and a delay circuit adjusting a period so that the two clock signals have a period when both of the two clock signals go low in logic in phase inversion.

In this case, a pair of clock signals having the period when both of the two clock signals go low in logic in phase inversion can be readily and automatically produced on the basis of the single clock signal.

A voltage generation circuit according to still another aspect of the present invention has a capacitor and generates a prescribed voltage through a node connected to a first terminal of the capacitor, and further comprises a first n-channel transistor having one of a source terminal and a drain terminal connected to the node with the other one of the source terminal and the drain terminal defining an output terminal outputting the prescribed voltage and a second n-channel transistor having one of a source terminal and a drain terminal as well as a gate terminal connected to the node with the other one of the source terminal and the drain terminal defining a reference potential terminal, while one of two clock signals inverted in phase to each other is applied to a second terminal of the capacitor and the other one of the two clock signals is applied to a gate terminal of the first n-channel transistor.

The voltage generation circuit can obtain an output voltage not influenced by the threshold voltage Vth of the first n-channel transistor serving as a driving transistor. When generating a negative voltage, for example, the driving transistor is reliably turned on also when the output negative voltage lowers, whereby the drivability of the driving transistor can be sufficiently secured regardless of the value of the negative voltage. Further, the n-channel transistor is employed as the driving transistor, whereby the operating speed of the voltage generation circuit can be increased as compared with the case of employing the p-channel transistor, and the drivability can be increased. When securing ability equivalent to that of the p-channel transistor with the n-channel transistor, further, the element areas of the transistors can be reduced.

The voltage generation circuit is preferably formed on a P-type semiconductor substrate having a triple well structure, the first n-channel transistor preferably includes a MOSFET formed on a P-type well to which the output terminal is connected for obtaining its back gate potential, the second n-channel transistor preferably includes a MOSFET formed on a P-type well to which the node is connected for obtaining its back gate potential, and the capacitor preferably includes an n-channel transistor separately formed on a P-type well with a source terminal and a drain terminal connected in common and a gate terminal connected to the node.

The voltage generation circuit may be formed on an N-type semiconductor substrate having a double well structure, the first n-channel transistor may include a MOS- FET formed on a P-type well to which the output terminal is connected for obtaining its back gate potential, the second n-channel transistor may include a MOSFET formed on a P-type well to which the node is connected for obtaining its back gate potential, and the capacitor may include an n-channel transistor separately formed on a P-type well with a source terminal and a drain terminal connected in common and a gate terminal connected to the node.

The voltage generation circuit is preferably formed on a glass substrate, an active layer of each of the first and second n-channel transistors is preferably formed from a semiconductor layer formed on the glass substrate, and at least one electrode of the capacitor is preferably formed from an n-type region formed on part of the semiconductor layer.

The voltage generation circuit preferably further comprises an inverter circuit for forming the two clock signals on the basis of a single clock signal.

In this case, the two clock signals can be formed from the single clock signal, whereby the structure of an external circuit can be simplified as compared with the case of employing the two clock signals from the first. Further, the voltage can be effectively generated due to a delay effect through the inverter circuit.

The two clock signals preferably have a period when both of the two clock signals go low in logic in phase inversion.

In this case, the two clock signals have the period when both of the two clock signals go low in logic, whereby the potential of the node can be set to a positive voltage after reliably turning off the driving transistors, for example, for effectively generating the negative voltage.

The voltage generation circuit may further comprise a logic circuit for forming the two clock signals on the basis of a single clock signal and a delay circuit adjusting a period so that the two clock signals have a period when both of the two clock signals go low in logic in phase inversion.

In this case, a pair of clock signals having the period when both of the two clock signals go low in logic in phase inversion can be readily and automatically produced on the basis of the single clock signal.

A voltage generation circuit according to a further aspect of the present invention has first and second capacitors and generates a prescribed voltage through first and second nodes connected to first terminals of the first and second capacitors respectively, and further comprises a first n-channel transistor having one of a source terminal and a drain terminal connected to the first node with the other one of the source terminal and the drain terminal defining an output terminal outputting the prescribed voltage, a second n-channel transistor having one of a source terminal and a drain terminal connected to the second node with the other one of the source terminal and the drain terminal defining an output terminal outputting the prescribed voltage, a third n-channel transistor having one of a source terminal and a drain terminal as well as a gate terminal connected to the first node with the other one of the source terminal and the drain terminal defining a reference potential terminal, and a fourth n-channel transistor having one of a source terminal and a drain terminal as well as a gate terminal connected to the second node with the other one of the source terminal and the drain terminal defining a reference potential terminal, while the output terminals of the first and second n-channel transistors are connected in common, a gate terminal of the first n-channel transistor is connected to the second node, a gate terminal of the second-n-channel transistor is connected to the first node, one of two clock signals inverted in phase to each other is applied to a second terminal of the first capacitor, and the other one of the two clock signals is applied to a second terminal of the second capacitor.

The voltage generation circuit can obtain an output voltage not influenced by the threshold voltage Vth of the first and second n-channel transistors serving as driving transistors. When generating a negative voltage, for example, the driving transistors are reliably turned on also when the output negative voltage lowers, whereby the drivability of the driving transistors can be sufficiently secured regardless of the value of the negative voltage. Further, the n-channel transistors are employed as the driving transistors, whereby the operating speed of the voltage generation circuit can be increased as compared with the case of employing the p-channel transistors, and the drivability can be increased. When securing ability equivalent to that of the p-channel transistors with the n-channel transistors, further, the element areas of the transistors can be reduced.

In addition, pumping operation is performed every half cycle of the clock signals, whereby pumping can be more efficiently performed for increasing the speed for reaching the target output voltage.

The voltage generation circuit is preferably formed on a P-type semiconductor substrate having a triple well structure, each of the first and second n-channel transistors preferably includes a MOSFET formed on a P-type well to which the output terminal is connected for obtaining its back gate potential, the third n-channel transistor preferably includes a MOSFET formed on a P-type well to which the first node is connected for obtaining its back gate potential, the fourth n-channel transistor preferably includes a MOSFET formed on a P-type well to which the second node is connected for obtaining its back gate potential, the first capacitor preferably includes an n-channel transistor separately formed on a P-type well with a source terminal and a drain terminal connected in common and a gate terminal connected to the first node, and the second capacitor preferably includes an n-channel transistor separately formed on a P-type well with a source terminal and a drain terminal connected in common and a gate terminal connected to the second node.

The voltage generation circuit may be formed on a P-type semiconductor substrate having a double well structure, each of the first and second n-channel transistors may include a MOSFET formed on a P-type well to which the output terminal is connected for obtaining its back gate potential, the third n-channel transistor may include a MOSFET formed on a P-type well to which the first node is connected for obtaining its back gate potential, the fourth n-channel transistor may include a MOSFET formed on a P-type well to which the second node is connected for obtaining its back gate potential, the first capacitor may include an n-channel transistor separately formed on a P-type well with a source terminal and a drain terminal connected in common and a gate terminal connected to the first node, and the second capacitor may include an n-channel transistor separately formed on a P-type well with a source terminal and a drain terminal connected in common and a gate terminal connected to the second node.

The voltage generation circuit may be formed on a glass substrate, an active layer of each of the first to fourth n-channel transistors may be formed from a semiconductor layer formed on the glass substrate, and at least one electrode of each of the first and second capacitors may be formed from an n-type region formed on part of the semiconductor layer.

The voltage generation circuit preferably further comprises an inverter circuit for forming the two clock signals on the basis of a single clock signal.

In this case, the two clock signals can be formed from the single clock signal, whereby the structure of an external circuit can be simplified as compared with the case of employing the two clock signals from the first. Further, the voltage can be effectively generated due to a delay effect through the inverter circuit.

The two clock signals preferably have a period when both of the two clock signals go low in logic in phase inversion.

In this case, the two clock signals have the period when both of the two clock signals go low in logic, whereby the potential of the node can be set to a positive voltage after reliably turning off the driving transistors, for example, for effectively generating the negative voltage.

The voltage generation circuit may further comprise a logic circuit for forming the two clock signals on the basis of a single clock signal and a delay circuit adjusting a period so that said two clock signals have a period when both of the two clock signals go low in logic in phase inversion.

In this case, a pair of clock signals having the period when both of the two clock signals go low in logic in phase inversion can be readily and automatically produced on the basis of the single clock signal.

A display unit according to a further aspect of the present invention comprises a plurality of display pixels arranged on intersections between a plurality of scan lines and a plurality of data lines in the form of a matrix, a plurality of active switching elements provided for the respective display pixels for controlling a voltage applied to the display pixels, a scan line driving circuit scanning the plurality of scan lines while applying a driving voltage for activating the plurality of active switching elements and a voltage generation circuit outputting a prescribed voltage to the scan line driving circuit, while the voltage generation circuit has a capacitor and generates the prescribed voltage through a node connected to a first terminal of the capacitor, the voltage generation circuit further includes an n-channel transistor having one of a source terminal and a drain terminal connected to the node with the other one of the source terminal and the drain terminal defining an output terminal outputting the prescribed voltage and a p-channel transistor having one of a source terminal and a drain terminal connected to the node with the other one of the source terminal and the drain terminal defining a reference potential terminal, gate terminals of the n-channel transistor and the p-channel transistor are connected in common, one of two clock signals inverted in phase to each other is applied to a second terminal of the capacitor, and the other one of the two clock signals is applied to the gate terminals connected in common.

When the voltage generation circuit generates a negative voltage in the display unit, power consumption can be reduced and operating margins of the active switching elements can be increased by employing a voltage from a prescribed negative voltage to half a power supply voltage, for example, as a voltage applied to the scan lines. Further, the capacitance of an external capacitor generally provided outside the display unit as an element for storing negative charges can be so reduced that this capacitor can be miniaturized or omitted.

When the display unit is a liquid crystal display unit generally required to reach a negative voltage as soon as possible upon power supply, the aforementioned voltage generation circuit can quickly supply the negative voltage due to its effective pumping operation. When AC-driving liquid crystal electrodes opposed to each other for reducing power consumption, the gate potential of pixel transistors can be set to a lower negative potential due to the large achieved negative voltage regardless of the threshold voltage of transistors, whereby the aforementioned voltage generation circuit can prevent data leak and reduce power consumption. Further, the display quality of the liquid crystal display unit can be improved by loading the voltage generation circuit having a large driving current (drivability) on the liquid crystal display unit.

The voltage generation circuit is preferably formed on a glass substrate, an active layer of each of the n-channel transistor and the p-channel transistor is preferably formed from a semiconductor layer formed on the glass substrate, and at least one electrode of the capacitor is preferably formed from an n-type region or a p-type region formed on part of the semiconductor layer.

The display unit preferably further comprises a level conversion circuit stepping up/converting the levels of signals applied to the voltage generation circuit as the clock signals. In this case, the voltage generation circuit can properly generate a voltage such as a prescribed negative voltage, for example, required by the display unit with the aforementioned level conversion circuit.

A display unit according to a further aspect of the present invention comprises a plurality of display pixels arranged on intersections between a plurality of scan lines and a plurality of data lines in the form of a matrix, a plurality of active switching elements provided for the respective display pixels for controlling a voltage applied to the display pixels, a scan line driving circuit scanning the plurality of scan lines while applying a driving voltage for activating the plurality of active switching elements and a voltage generation circuit outputting a prescribed voltage to the scan line driving circuit, while the voltage generation circuit has first and second capacitors and generates the prescribed voltage through first and second nodes connected to first terminals of the first and second capacitors respectively, the voltage generation circuit further includes a first n-channel transistor having one of a source terminal and a drain terminal connected to the first node with the other one of the source terminal and the drain terminal defining an output terminal outputting the prescribed voltage, a second n-channel transistor having one of a source terminal and a drain terminal connected to the second node with the other one of the source terminal and the drain terminal defining an output terminal outputting the prescribed voltage, a first p-channel transistor having one of a source terminal and a drain terminal connected to the first node with the other one of the source terminal and the drain terminal defining a reference potential terminal and a second p-channel transistor having one of a source terminal and a drain terminal connected to the second node with the other one of the source terminal and the drain terminal defining a reference potential terminal, a gate terminal of the first n-channel transistor and a gate terminal of the first p-channel transistor are connected in common and connected to the second node, a gate terminal of the second n-channel transistor and a gate terminal of the second p-channel transistor are connected in common and connected to the first node, the output terminals of the first and second n-channel transistors are connected in common, one of two clock signals inverted in phase to each other is applied to a second terminal of the first capacitor, and the other one of the two clock signals is applied to a second terminal of the second capacitor.

When the voltage generation circuit generates a negative voltage in the display unit, power consumption can be reduced and operating margins of the active switching elements can be increased by employing a voltage from a prescribed negative voltage to half a power supply voltage, for example, as a voltage applied to the scan lines. Further, the capacitance of an external capacitor generally provided outside the display unit as an element for storing negative charges can be so reduced that this capacitor can be miniaturized or omitted.

When the display unit is a liquid crystal display unit generally required to reach a negative voltage as soon as possible upon power supply, the aforementioned voltage generation circuit can quickly supply the negative voltage due to its effective pumping operation. When AC-driving liquid crystal electrodes opposed to each other for reducing power consumption, the gate potential of pixel transistors can be set to a lower negative potential due to the large achieved negative voltage regardless of the threshold voltage of transistors, whereby the aforementioned voltage generation circuit can prevent data leak and reduce power consumption. Further, the display quality of the liquid crystal display unit can be improved by loading the voltage generation circuit having a large driving current (drivability) on the liquid crystal display unit.

The voltage generation circuit is preferably formed on a glass substrate, an active layer of each of the first and second n-channel transistors and the first and second p-channel transistors is preferably formed from a semiconductor layer formed on the glass substrate, and at least one electrode of each of the first and second capacitors is formed from an n-type region or a p-type region formed on part of the semiconductor layer.

The display unit preferably further comprises a level conversion circuit stepping up/converting the levels of signals applied to the voltage generation circuit as the clock signals. In this case, the voltage generation circuit can properly generate a voltage such as a prescribed negative voltage, for example, required by the display unit with the aforementioned level conversion circuit.

A display unit according to a further aspect of the present invention comprises a plurality of display pixels arranged on intersections between a plurality of scan lines and a plurality of data lines in the form of a matrix, a plurality of active switching elements provided for the respective display pixels for controlling a voltage applied to the display pixels, a scan line driving circuit scanning the plurality of scan lines while applying a driving voltage for activating the plurality of active switching elements and a voltage generation circuit outputting a prescribed voltage to the scan line driving circuit, while the voltage generation circuit has a capacitor and generates a prescribed voltage through a node connected to a first terminal of the capacitor, the voltage generation circuit further includes a first n-channel transistor having one of a source terminal and a drain terminal connected to the node with the other one of the source terminal and the drain terminal defining an output terminal outputting the prescribed voltage and a second n-channel transistor having one of a source terminal and a drain terminal as well as a gate terminal connected to the node with the other one of the source terminal and the drain terminal defining a reference potential terminal, one of two clock signals inverted in phase to each other is applied to a second terminal of the capacitor, and the other one of the two clock signals is applied to a gate terminal of the first n-channel transistor.

When the voltage generation circuit generates a negative voltage in the display unit, power consumption can be reduced and operating margins of the active switching elements can be increased by employing a voltage from a prescribed negative voltage to half a power supply voltage, for example, as a voltage applied to the scan lines. Further, the capacitance of an external capacitor generally provided outside the display unit as an element for storing negative charges can be so reduced that this capacitor can be miniaturized or omitted.

When the display unit is a liquid crystal display unit generally required to reach a negative voltage as soon as possible upon power supply, the aforementioned voltage generation circuit can quickly supply the negative voltage due to its effective pumping operation. When AC-driving liquid crystal electrodes opposed to each other for reducing power consumption, the gate potential of pixel transistors can be set to a lower negative potential due to the large achieved negative voltage regardless of the threshold voltage of transistors, whereby the aforementioned voltage generation circuit can prevent data leak and reduce power consumption. Further, the display quality of the liquid crystal display unit can be improved by loading the voltage generation circuit having a large driving current (drivability) on the liquid crystal display unit.

The voltage generation circuit is preferably formed on a glass substrate, an active layer of each of the first and second n-channel transistors is preferably formed from a semiconductor layer formed on the glass substrate, and at least one electrode of the capacitor is preferably formed from an n-type region formed on part of the semiconductor layer.

The display unit preferably further comprises a level conversion circuit stepping up/converting the levels of signals applied to the voltage generation circuit as the clock signals. In this case, the voltage generation circuit can properly generate a voltage such as a prescribed negative voltage, for example, required by the display unit with the aforementioned level conversion circuit.

A display unit according to a further aspect of the present invention comprises a plurality of display pixels arranged on intersections between a plurality of scan lines and a plurality of data lines in the form of a matrix, a plurality of active switching elements provided for the respective display pixels for controlling a voltage applied to the display pixels, a scan line driving circuit scanning the plurality of scan lines while applying a driving voltage for activating the plurality of active switching elements and a voltage generation circuit outputting a prescribed voltage to the scan line driving circuit, while the voltage generation circuit has first and second capacitors and generates the prescribed voltage through first and second nodes connected to first terminals of the first and second capacitors respectively, the voltage generation circuit further includes a first n-channel transistor having one of a source terminal and a drain terminal connected to the first node with the other one of the source terminal and the drain terminal defining an output terminal outputting the prescribed voltage, a second n-channel transistor having one of a source terminal and a drain terminal connected to the second node with the other one of the source terminal and the drain terminal defining an output terminal outputting the prescribed voltage, a third n-channel transistor having one of a source terminal and a drain terminal as well as a gate terminal connected to the first node with the other one of the source terminal and the drain terminal defining a reference potential, and a fourth n-channel transistor having one of a source terminal and a drain terminal as well as a gate terminal connected to the second node with the other one of the source terminal and the drain terminal defining a reference potential terminal, the output terminals of the first and second n-channel transistors are connected in common, a gate terminal of the first n-channel transistor is connected to the second node, a gate terminal of the second n-channel transistor is connected to the first node, one of two clock signals inverted in phase to each other is applied to a second terminal of the first capacitor, and the other one of the two clock signals is applied to a second terminal of the second capacitor.

When the voltage generation circuit generates a negative voltage in the display unit, power consumption can be reduced and operating margins of the active switching elements can be increased by employing a voltage from a prescribed negative voltage to half a power supply voltage, for example, as a voltage applied to the scan lines. Further, the capacitance of an external capacitor generally provided outside the display unit as an element for storing negative charges can be so reduced that this capacitor can be miniaturized or omitted.

When the display unit is a liquid crystal display unit generally required to reach a negative voltage as soon as possible upon power supply, the aforementioned voltage generation circuit can quickly supply the negative voltage due to its effective pumping operation. When AC-driving liquid crystal electrodes opposed to each other for reducing power consumption, the gate potential of pixel transistors can be set to a lower negative potential due to the large achieved negative voltage regardless of the threshold voltage of transistors, whereby the aforementioned voltage generation circuit can prevent data leak and reduce power consumption. Further, the display quality of the liquid crystal display unit can be improved by loading the voltage generation circuit having a large driving current (drivability) on the liquid crystal display unit.

The voltage generation circuit is preferably formed on a glass substrate, an active layer of each of the first to fourth n-channel transistors is preferably formed from a semiconductor layer formed on the glass substrate, and at least one electrode of each of the first and second capacitors is formed from an n-type region formed on part of the semiconductor layer.

The display unit preferably further comprises a level conversion circuit stepping up/converting the levels of signals applied to the voltage generation circuit as the clock signals. In this case, the voltage generation circuit can properly generate a voltage, such as a prescribed negative voltage, for example, required by the display unit with the aforementioned level conversion circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a graph showing other electric characteristics of the voltage generation circuit shown in FIG. 11 and the conventional voltage generation circuit in comparison with each other;

FIG. 15 is a graph showing further electric characteristics of the voltage generation circuit shown in FIG. 11 and the conventional voltage generation circuit in comparison with each other;

FIG. 17 is a circuit diagram showing an equivalent circuit of the voltage generation circuit corresponding to the exemplary structure shown in FIG. 16;

FIG. 19 is a circuit diagram showing an equivalent circuit of the voltage generation circuit corresponding to the exemplary structure shown in FIG. 18;

DESCRIPTION OF THE PREFERRED EMBODIMENTS (First Embodiment)

A voltage generation circuit according to a first embodiment of the present invention is now described with reference to FIGS. 1 to 4. First, the basic structure of the voltage generation circuit according to the first embodiment of the present invention is described with reference to FIG. 1.

Figure 1:
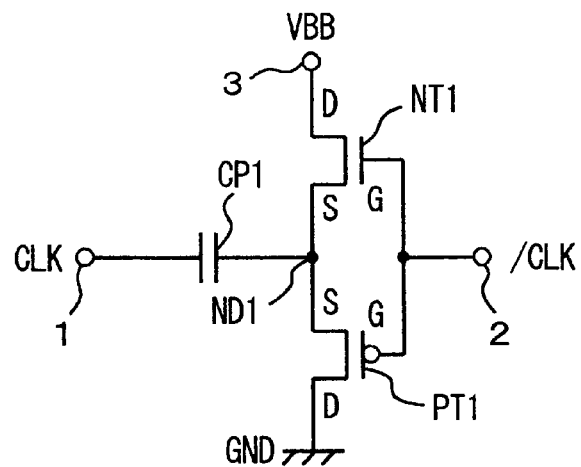
FIG. 1 is a circuit diagram showing the basic circuit structure of a voltage generation circuit according to a first operation of the present invention.

The voltage generation circuit shown in FIG. 1 comprises a capacitor (pumping capacitor) CP1, an n-channel MOS transistor NT1, a p-channel MOS transistor PT1 and the like.

The n-channel MOS transistor (driving transistor) NT1 has a source terminal S connected to a node ND1 and a drain terminal D defining a voltage output terminal 3 outputting a negative voltage VBB. The p-channel MOS transistor PT1 has a source terminal S connected to the node ND1 and a drain terminal D defining a ground terminal (reference potential terminal). Gate terminals G of the n-channel MOS transistor NT1 and the p-channel MOS transistor PT1 are connected in common, and the common node therebetween is connected to a clock input terminal 2.

The capacitor CP1 has a first electrode connected to the node ND1 and a second electrode connected to a clock input terminal 1. Clock signals CLK and /CLK ("/" denotes logic inversion) inverted in phase to each other are applied to the clock input terminals 1 and 2 respectively. The capacitor CP1 may be formed by an n-channel MOS transistor or a p-channel MOS transistor having a source terminal and a drain terminal connected in common.

The outline of operation for generating the voltage (negative voltage) from the voltage generation circuit having the aforementioned structure is now described with reference to FIG. 2. The clock signals CLK and /CLK shown at (a) and (b) in FIG. 2 are merely inverted in phase to each other.

Figure 2:
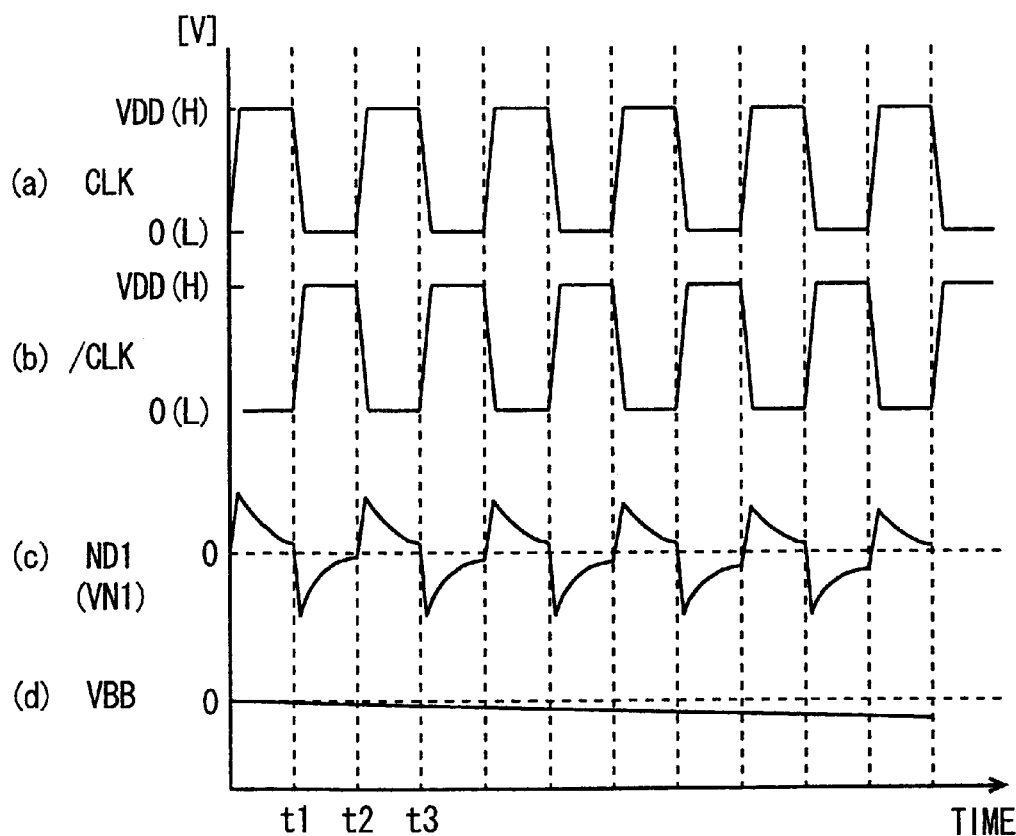
FIG. 2 is a timing chart for illustrating operation of the voltage generation circuit shown in FIG. 1.

When the clock signal CLK starts to go low (0 V) at a time t1 shown in FIG. 2, the potential VN1 of the node ND1 lowers to reach a negative voltage (see (a) and (c) in FIG. 2). When the clock signal /CLK goes high (VDD) at this time, the n-channel MOS transistor NT1 is turned on, and charges proportional to the capacitance of the capacitor CP1 flow from the drain terminal D of the transistor NT1 toward the node ND1. These charges are stored in the capacitor CP1 since the p-channel MOS transistor PT1 is in an OFF state and the potential VN1 of the node ND1 rises in response thereto (see (c) in FIG. 2).

Then, the clock signal CLK starts to go high at a time t2, whereby the potential VN1 of the node ND1 is pulled up by a level corresponding to the high level (VDD) of the clock signal CLK, and further rises. When the clock signal CLK goes high, the clock signal /CLK goes low to turn on the p-channel MOS transistor PT1. Therefore, the charges stored in the capacitor CP1 are extracted to the ground terminal (GND), followed by reduction of the potential VN1 of the node ND1 (see (c) in FIG. 2).

The clock signal CLK starts to go low again at a time t3, whereby operation similar to that at the aforementioned time t1 is performed. The aforementioned operation is so repeated as to pump the charges from the drain terminal D of the n-channel MOS transistor NT1 to the ground terminal every cycle of the clock signals CLK and /CLK, for rendering the voltage VBB of the drain terminal D of the n-channel MOS transistor NT1 negative (see (d) in FIG. 2).

The theoretical value of the negative voltage VBB in the aforementioned voltage generation circuit reaches (Vthp1–VDD).

Also when the output negative voltage VBB lowers, the potential difference between the source terminal S and the gate terminal G for turning on the n-channel MOS transistor NT1 is supplied by the clock signal /CLK and hence drivability of the n-channel MOS transistor NT1 can be sufficiently guaranteed regardless of the value of the negative voltage VBB.

Further, the n-channel transistor NT1 is employed as the driving transistor, whereby the operating speed can be increased as compared with the case of employing the p-channel transistor as the driving transistor due to its characteristics, and the drivability can be improved. When securing ability equivalent to that of the p-channel transistor with the n-channel transistor, the element areas of the transistors can be reduced.

The outline of the sectional structure of the voltage generation circuit according to this embodiment formed on a semiconductor substrate is now described with reference to FIG. 3. FIG. 4 shows an equivalent circuit of this case.

Figure 3:
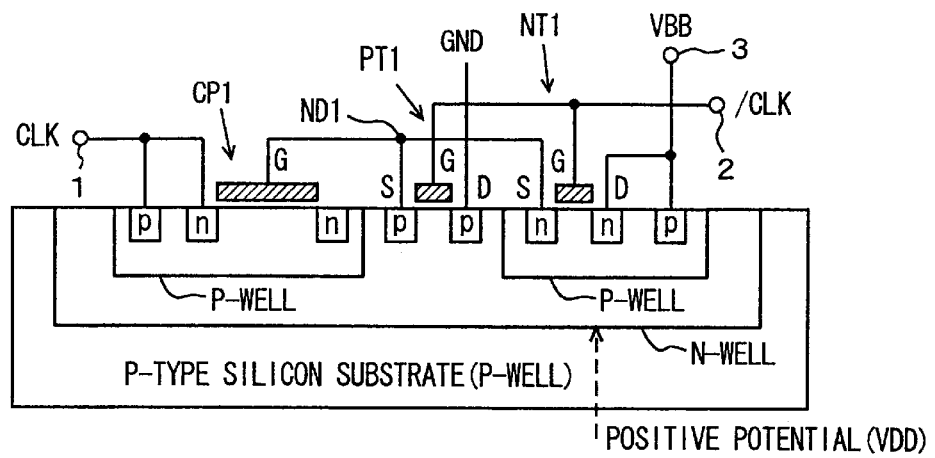
FIG. 3 is a sectional view showing an exemplary structure of the voltage generation circuit shown in FIG. 1 formed on a triple well structure.
Figure 4:
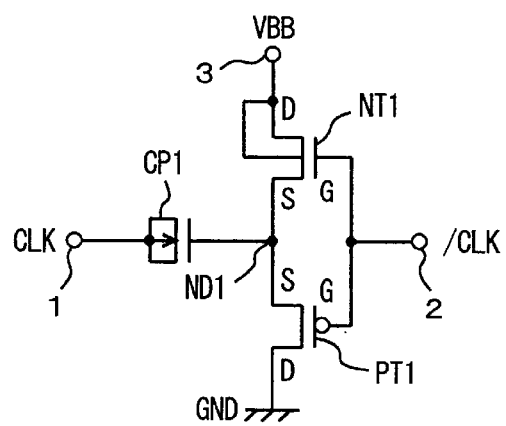
FIG. 4 is a circuit diagram showing an equivalent circuit of the voltage generation circuit corresponding to the exemplary structure shown in FIG. 3.

As shown in FIG. 3, the voltage generation circuit is formed on a P-type silicon substrate having a triple well structure of P-type wells, an N-type well and still another P-type well (P-wells, an N-well and still another P-well).

The n-channel MOS transistor NT1 is formed on the P-type well as a MOSFET (field-effect transistor), and the drain terminal D (voltage output terminal) is connected to this P-type well for obtaining its back gate potential.

The p-channel MOS transistor PT1 is formed on the N-type well as a MOSFET, and a positive potential (VDD) is applied to this N-type well for obtaining its back gate potential.

The capacitor CP1 is separately formed on the other P-type well as an n-channel MOSFET having a source terminal and a drain terminal connected in common, and its gate terminal G is connected to the node ND1.

According to the voltage generation circuit of the first embodiment, as hereinabove described, the following effects can be attained:

(1) When the output negative voltage VBB lowers, the n-channel MOS transistor NT1 is reliably turned on and hence the drivability of the n-channel MOS transistor NT1 can be sufficiently guaranteed regardless of the value of the output negative voltage VBB.

(2) The n-channel transistor is employed as the driving transistor, whereby the operating speed can be increased as compared with the case of employing the p-channel transistor as the driving transistor, and the drivability thereof can be improved. When securing ability equivalent to that of the p-channel transistor with the n-channel transistor, the element areas of the transistors can be reduced.

Figure 5:
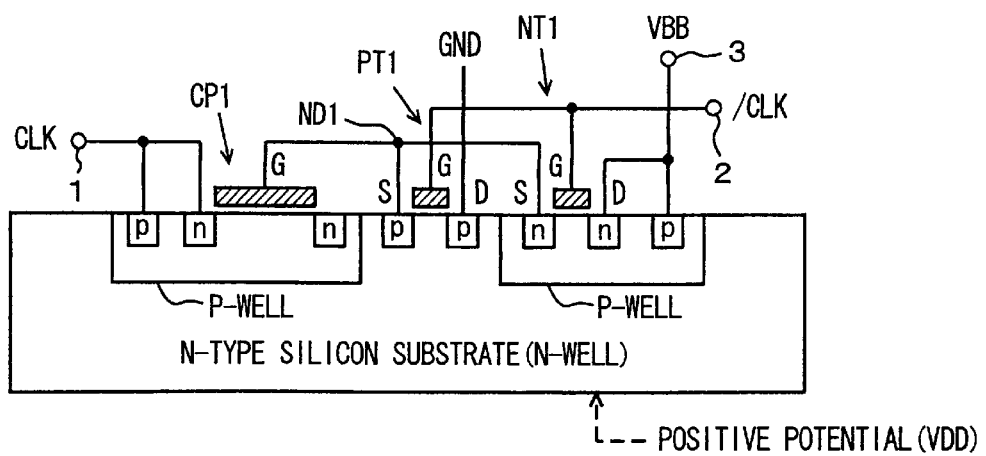
FIG. 5 is a sectional view showing an exemplary structure of the voltage generation circuit shown in FIG. 1 formed on a double well structure.

The aforementioned first embodiment can also be carried out in the following modes:

(1) While the voltage generation circuit is formed on the P-type silicon substrate having a triple well structure in the first embodiment, the present invention is not particularly restricted to this. The aforementioned voltage generation circuit may alternatively be formed on an N-type silicon substrate having a double well structure of an N-type well and P-type wells as shown in FIG. 5, for example.

Figure 6:
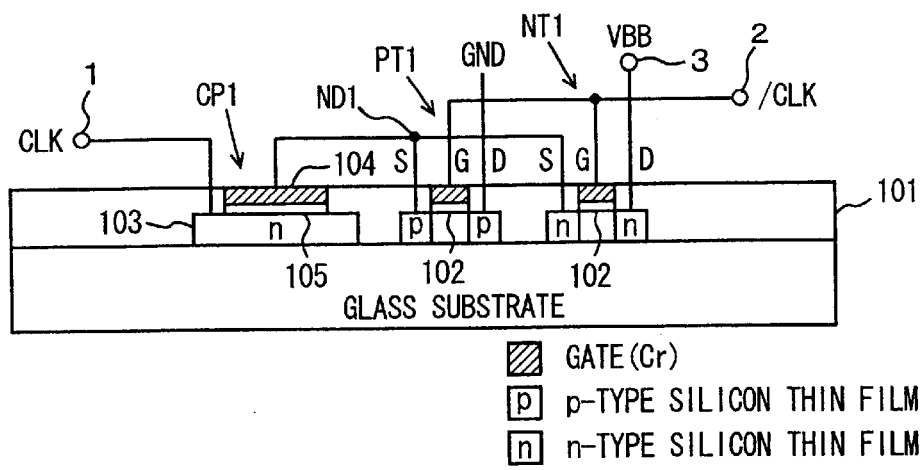
FIG. 6 is a sectional view showing an exemplary structure of the voltage generation circuit shown in FIG. 1 formed on a glass substrate.

(2) The aforementioned voltage generation circuit may alternatively be formed on a glass substrate, as shown in FIG. 6. In this case, each active layer (source/drain region) of the n-channel MOS transistor NT1 and the p-channel MOS transistor PT1 is formed from a semiconductor layer of polycrystalline silicon or amorphous silicon located in an interlayer isolation film 101 provided on the glass substrate. The gate electrode G of each of the transistors NT1 and PT1 is formed by a thin film of metal chromium (Cr), for example. Alternatively, the gate electrode G may be formed by a silicide thin film.

The capacitor CP1 is also formed on the aforementioned glass substrate, at least one electrode (a lower electrode 103 in FIG. 6) thereof is formed by an n-type region or a p-type region (the n-type region in FIG. 6) formed on part of the aforementioned semiconductor layer, and an upper electrode 104 is formed by the aforementioned thin film of metal chromium (Cr), for example. A dielectric film 105 of the capacitor CP1 is formed by the same insulator film, such as a silicon oxide film, for example, as a gate electrode oxide film 102 of each of the aforementioned transistors NT1 and PT1, for example.

(Second Embodiment)

Figure 7:
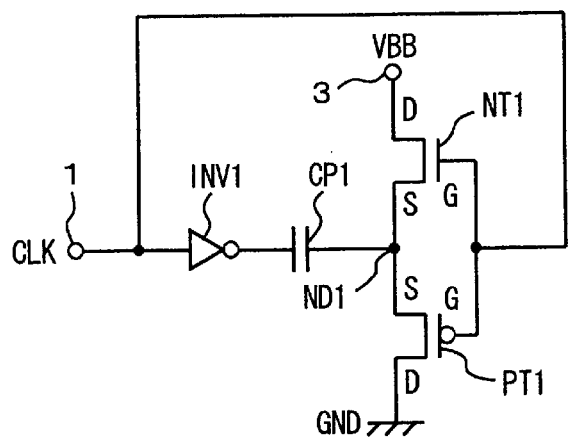
FIG. 7 is a circuit diagram showing the basic circuit structure of a voltage generation circuit according to a second embodiment of the present invention.

A voltage generation circuit according to a second embodiment of the present invention is now described with reference to FIG. 7. The voltage generation circuit according to the second embodiment is described mainly with reference to a point different from the voltage generation circuit according to the first embodiment shown in FIG. 1, and elements of the second embodiment identical to those of the voltage generation circuit shown in FIG. 1 are denoted by the same reference numerals, to omit redundant description.

The structural difference between the second embodiment and the first embodiment resides in the following point: As shown in FIG. 7, an inverter INV1 is provided between a clock input terminal 1 and a capacitor CP1 in the voltage generation circuit according to this embodiment. A clock signal CLK is applied to a common node between gate terminals G of an n-channel MOS transistor NT1 and a p-channel MOS transistor PT1 as such, and applied to the capacitor CP1 through the inverter INV1.

In place of the pair of clock signals CLK and /CLK inverted in phase to each other shown in FIG. 1, therefore, the voltage generation circuit according to the second embodiment can receive only the single clock signal CLK.

Further, a negative voltage VBB can be efficiently generated due to a delay effect through the inverter INV1 by applying the clock signal CLK in the aforementioned manner. A node ND1 can be set in a positive voltage state while reducing a conducting state of the n-channel MOS transistor NT1 and the positive voltage can be inhibited from influencing the drain terminal D, set in a negative voltage state, of the n-channel MOS transistor NT1 at the time t1 shown in FIG. 2.

According to the voltage generation circuit of the second embodiment, as hereinabove described, the following effects can be attained in addition to the effects of the voltage generation circuit according to the first embodiment:

(1) The voltage generation can receive only one clock signal CLK, whereby the structure of an external circuit generating the clock signal CLK can be simplified as compared with the case of employing the two clock signals CLK and /CLK.

(2) The negative voltage can be efficiently generated due to the delay effect through the inverter INV.

Figure 8:
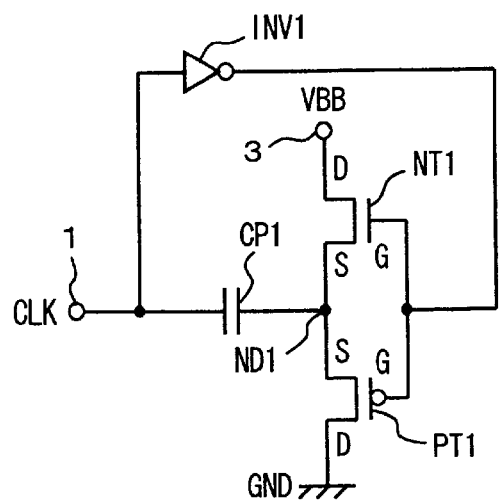
FIG. 8 is a circuit diagram showing a modification of the voltage generation circuit shown in FIG. 7.

The aforementioned second embodiment can also be carried out in the following mode: As shown in FIG. 8, the inverter INV1 may be so provided as to apply the clock signal CLK to the common node between the gate terminals G of the n-channel MOS transistor NT1 and the p-channel MOS transistor PT1 through the inverter INV1.

(3) Third Embodiment

A voltage generation circuit according to a third embodiment of the present invention is now described with reference to FIGS. 9 to 15. The voltage generation circuit according to the third embodiment is described mainly with reference to a point different from the voltage generation circuit according to the first embodiment shown in FIG. 1, and elements of the third embodiment identical to those of the voltage generation circuit shown in FIG. 1 are denoted by the same reference numerals, to omit redundant description.

The structural difference between the third embodiment and the first embodiment resides in the following point: According to this embodiment, a pair of voltage generation circuits shown in FIG. 1 are employed. A voltage generation circuit capable of more efficiently performing pumping can be implemented due to this circuit structure. The theoretical value of the negative voltage VBB reaches the maximum theoretical value (−VDD) and hence a voltage generation circuit capable of generating a large negative voltage can be implemented.

Figure 9:
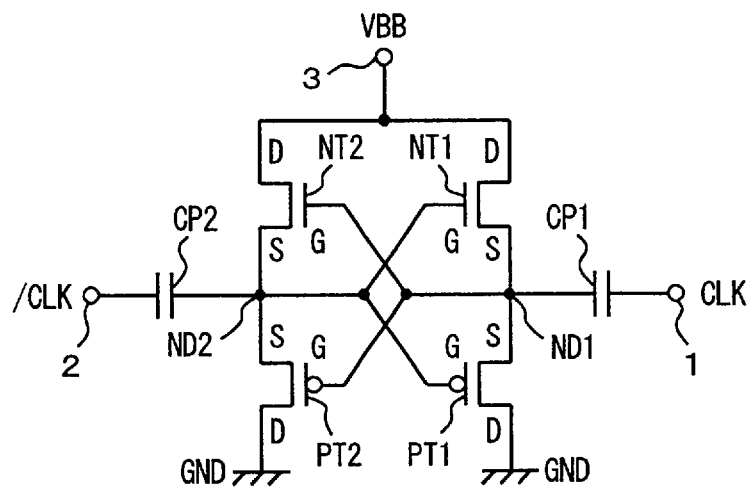
FIG. 9 is a circuit diagram showing the basic circuit structure of a voltage generation circuit according to a third embodiment of the present invention.

The voltage generation circuit shown in FIG. 9 has two capacitors (pumping capacitors) CP1 and CP2, and generates a prescribed negative voltage VBB through nodes ND1 and ND2 connected to single terminals of the capacitors CP1 and CP2, respectively.

The voltage generation circuit comprises two pairs of transistors NT1, PT1, NT2 and PT2, and the n-channel MOS transistors NT1 and NT2 have source terminals S connected to the nodes ND1 and ND2 respectively and drain terminals D connected in common for defining a voltage output terminal 3 outputting the negative potential VBB. The p-channel MOS transistors PT1 and PT2 have source terminals S connected to the nodes ND1 and ND2, respectively, and drain terminals D defining ground terminals (reference potential terminals).

Gate terminals G of the n-channel MOS transistor NT1 and the p-channel MOS transistor PT1 are connected in common and connected to the node ND2. Gate terminals G of the n-channel MOS transistor NT2 and the p-channel MOS transistor PT2 are connected in common and connected to the node ND1.

Terminals of the capacitors CP1 and CP2 not connected to the nodes ND1 and ND2 define clock input terminals 1 and 2, to which clock signals CLK and /CLK inverted in phase to each other are applied respectively.

The outline of operation of generating the negative voltage from the voltage generation circuit having the aforementioned structure is now described with reference to FIG. 10.

Figure 10:
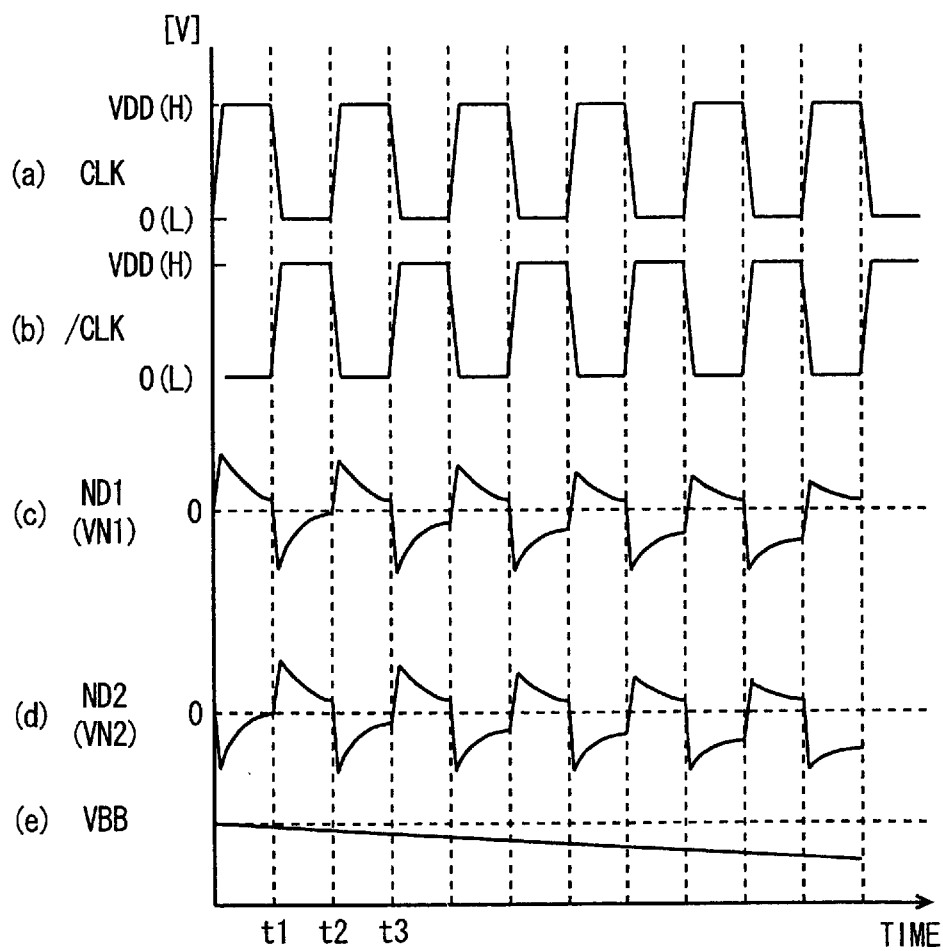
FIG. 10 is a timing chart for illustrating operation of the voltage generation circuit shown in FIG. 9.

When the clock signal CLK starts to go low (0 V) at a time t1 shown in FIG. 10, the potential VN1 of the node ND1 lowers to reach a negative voltage (see (a) and (c) in FIG. 10), while the n-channel MOS transistor NT2 makes transition to an OFF state and the p-channel MOS transistor PT2 makes transition to an ON state in response thereto. At this time, there is no difference by the threshold voltage (Vthp2) between the node ND2 and the ground voltage GND since the gate potential of the p-channel MOS transistor PT2 is a negative potential, and the charges in the node ND2 are extracted to GND.

When the clock signal /CLK starts to go high (VDD), the potential VN2 of the node ND2 is pulled up by a level corresponding to the high level (VDD) of the clock signal /CLK (see (b) and (d) in FIG. 10) and rises, while the n-channel MOS transistor NT1 makes transition to an ON state and the p-channel MOS transistor PT1 makes transition to an OFF state in response thereto.

At this time, the p-channel MOS transistor PT2 is turned on so that charges stored in the capacitor CP2 are extracted to the ground terminal (GND), followed by reduction of the potential VN2 of the node ND2 (see (d) in FIG. 10).

Due to the transition of the n-channel MOS transistor NT1 to the ON state, further, charges proportional to the capacitance of the capacitor C1 flow from the drain terminal D of the n-channel MOS transistor NT1 toward the node ND1. These charges are stored in the capacitor CP1 because the p-channel MOS transistor PT1 is in an OFF state, and the potential VN1 of the node ND1 rises in response thereto (see (c) in FIG. 10).

Then, the clock signal CLK starts to go high and the clock signal /CLK starts to go low at a time t2, whereby the pairs of transistors perform operation reverse to that at the aforementioned time t1.

When the clock signal CLK starts to go high H at the time t2, the potential VN1 of the node ND1 is pulled up by a level corresponding to the high level (VDD) of the clock signal CLK (see (a) and (c) in FIG. 10) and rises, while the n-channel MOS transistor NT2 makes transition to an ON state and the p-channel MOS transistor PT2 makes transition to an OFF state in response thereto.

When the clock signal /CLK starts to go low, the potential VN2 of the node N2 lowers to a negative voltage (see (b) and (d) in FIG. 10) while the n-channel MOS transistor NT1 makes transition to an OFF state and the p-channel MOS transistor PT1 makes transition to an ON state in response thereto. At this time, there is no difference by the threshold voltage (Vthp1) between the node ND1 and the ground voltage GND since the gate potential of the p-channel MOS transistor PT1 is a negative potential, and the charges in the node ND1 are extracted to GND.

At this time, the p-channel MOS transistor PT1 is turned on so that the charges stored in the capacitor CP1 are extracted to the ground terminal (GND), followed by reduction of the potential VN1 of the node ND1 (see (c) in FIG. 10).

Further, the n-channel MOS transistor NT2 is turned on so that charges proportional to the capacitance of the capacitor CP2 flow from the drain terminal D of the n-channel MOS transistor NT2 toward the node ND2. These charges are stored in the capacitor CP2 since the p-channel MOS transistor PT2 is in an OFF state, and the potential VN2 of the node ND2 rises in response thereto (see (d) in FIG. 10).

The clock signal CLK starts to go low again at a time t3, whereby operation similar to that at the aforementioned time t1 is performed. The aforementioned operation is so repeated as to pump the charges from the drain terminal D of either the n-channel MOS transistor NT1 or NT2 every half cycle of the clock signal CLK or /CLK, for rendering the voltage VBB of the drain terminal D negative (see (e) in FIG. 10).

According to the voltage generation circuit of this embodiment, pumping can be more efficiently performed by carrying out pumping operation for rendering the voltage negative every half cycle of the clock signal. Consequently, the speed for rendering the voltage negative can be increased beyond that of the voltage generation circuit according to the first embodiment, as clearly understood when comparing (d) in FIG. 2 with (e) in FIG. 10.

The outline of the sectional structure of the voltage generation circuit according to this embodiment formed on a semiconductor substrate is now described with reference to FIG. 11. FIG. 12 shows an equivalent circuit of this case.

Figure 11:
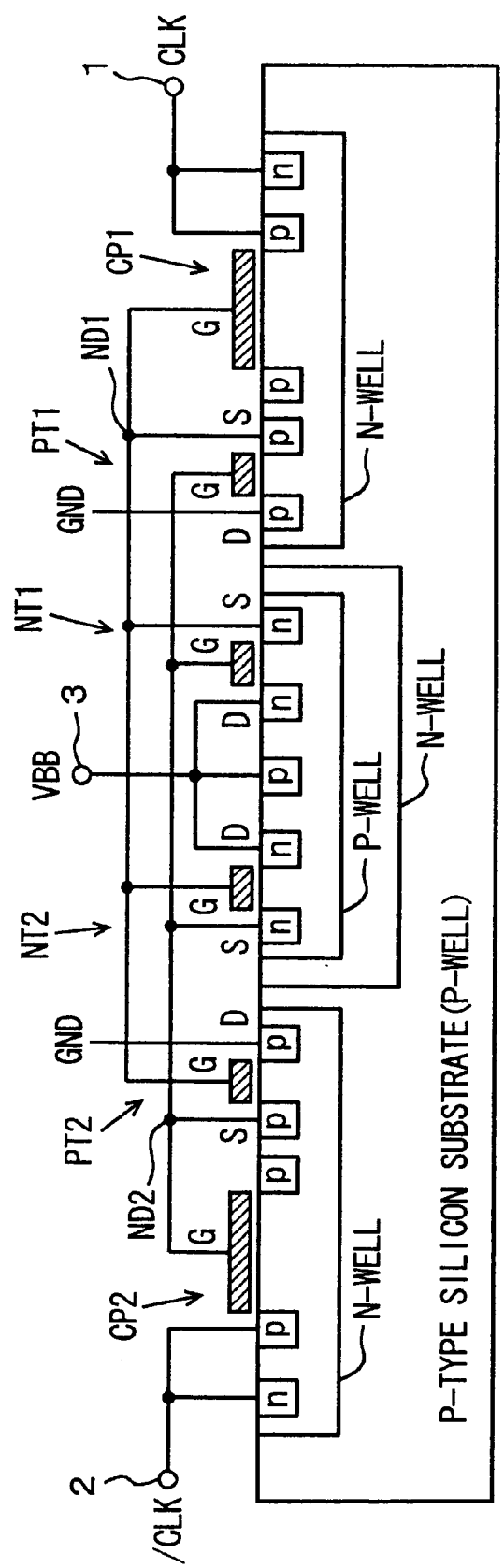
FIG. 11 is a sectional view showing an exemplary structure of the voltage generation circuit shown in FIG. 9 formed on a triple well structure.
Figure 12:
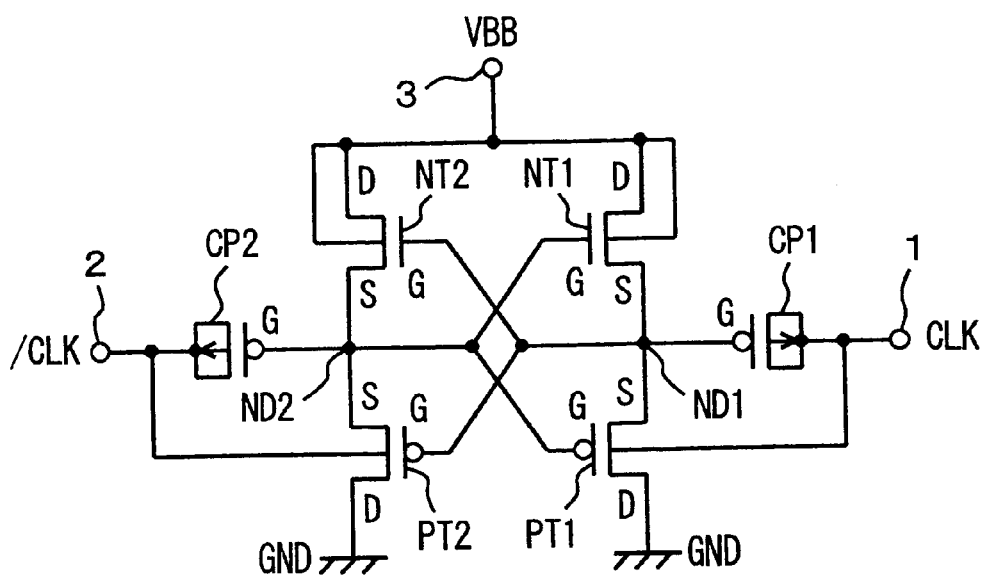
FIG. 12 is a circuit diagram showing an equivalent circuit of the voltage generation circuit corresponding to the exemplary structure shown in FIG. 11.

As shown in FIG. 11, the voltage generation circuit according to this embodiment is also formed on a P-type silicon substrate having a triple well structure of a P-type well, N-type wells and another P-type well, similarly to the voltage generation circuit according to the first embodiment.

The n-channel transistors NT1 and NT2 are formed on the P-type well as MOSFETs respectively, and each drain terminal D (the voltage output terminal 3) is connected to the P-type well for obtaining back gate potentials thereof.

The p-channel transistors PT1 and PT2 are formed on the N-type wells as MOSFETs, and the clock signals CLK and /CLK are applied to the corresponding N-type wells respectively for obtaining back gate potentials thereof.

The capacitor CP1 is separately formed on the N-type well as a p-channel transistor having a source terminal and a drain terminal connected in common and its gate terminal G is connected to the node ND1, while the capacitor CP2 is separately formed on the other N-type well as a p-channel transistor having a source terminal and a drain terminal connected in common and its gate terminal G is connected to the node ND2.

Figure 13:
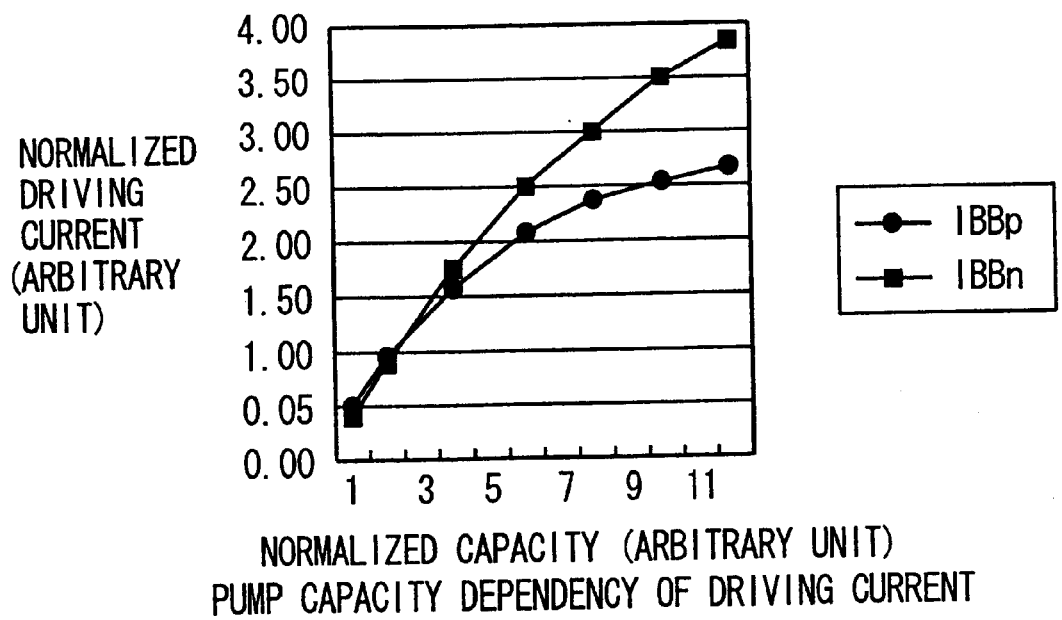
FIG. 13 is a graph showing electric characteristics of the voltage generation circuit shown in FIG. 11 and a conventional voltage generation circuit in comparison with each other.
Figure 42:
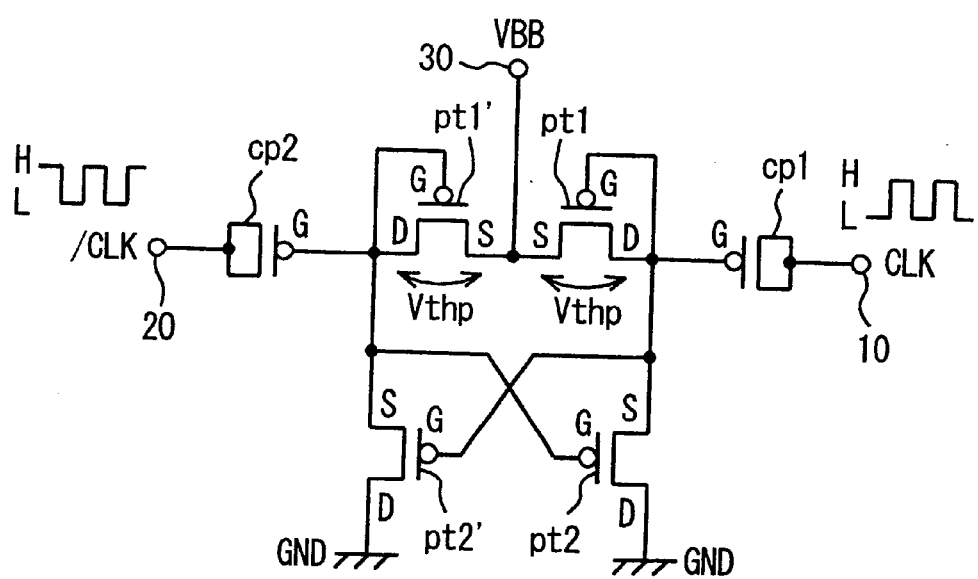
FIG. 42 is a circuit diagram showing the basic circuit structure of another conventional voltage generation circuit.

FIGS. 13 to 15 show the differences between current driving characteristics of the voltage generation circuit according to this embodiment formed on the P-type silicon substrate having a triple well structure as described above and the conventional voltage generation circuit (voltage generation circuit formed on a P-type silicon substrate having a double well structure of a P-type well and an N-type well and using a p-channel MOS transistor as a driving transistor) shown in FIG. 42. Referring to FIGS. 13 to 15, "IBBp" denotes a driving current by the aforementioned conventional voltage generation circuit, and "IBBn" denotes a driving current by the voltage generation circuit according to this embodiment.

FIG. 13 shows the results of simulation of the values of the driving currents flowing from the voltage output terminals 3 and 30 to the ground terminals (GND) when setting the sizes of the driving transistors identical while varying the capacitance of the capacitors. In this simulation, a power supply voltage of 3.3 V, a rule of 0.35 $\mu$m, the room temperature and the like are employed as parameters.

It is understood from FIG. 13 that the driving current of the n-channel MOS transistor exceeds that of the p-channel MOS transistor when the capacitance of the capacitor is increased. This indicates that this embodiment employing the n-channel MOS transistor as the driving transistor is more advantageous for obtaining a large driving current, and can reduce the size of the driving transistor for obtaining the same driving current.

FIG. 14 shows results of simulation of values of driving currents when setting the transistor sizes and the aforementioned parameters identical while varying the initial voltage values (VBB) of the voltage output terminals 3 and 30.

It is understood from FIG. 14 that the drivability of the p-channel MOS transistor is reduced as compared with the n-channel MOS transistor as the voltage VBB of the voltage output terminal is rendered negative. This indicates superiority of the drivability of the n-channel MOS transistor at the prescribed negative voltage VBB.

FIG. 15 shows results of simulation of values of the driving currents when setting the transistor sizes identical while varying power supply voltages. Referring to FIG. 15, a rule of 0.18 $\mu$m is employed as a parameter.

It is understood from FIG. 15 that the drivability of the n-channel MOS transistor is superior to that of the p-channel MOS transistor also when the power supply voltage is set to a low level. This indicates superiority of the drivability of the n-channel MOS transistor in the case of setting the power supply voltage to a low level.

According to the voltage generation circuit of the third embodiment, as hereinabove described, the following effects can be attained in addition to the effects of the voltage generation circuit according to the aforementioned first embodiment: In the voltage generation circuit according to this embodiment, the pumping operation for rendering the voltage negative is performed every half cycle of the clock signal so that pumping can be more efficiently performed. Consequently, the speed for rendering the voltage negative can be increased in the voltage generation circuit.

Figure 16:
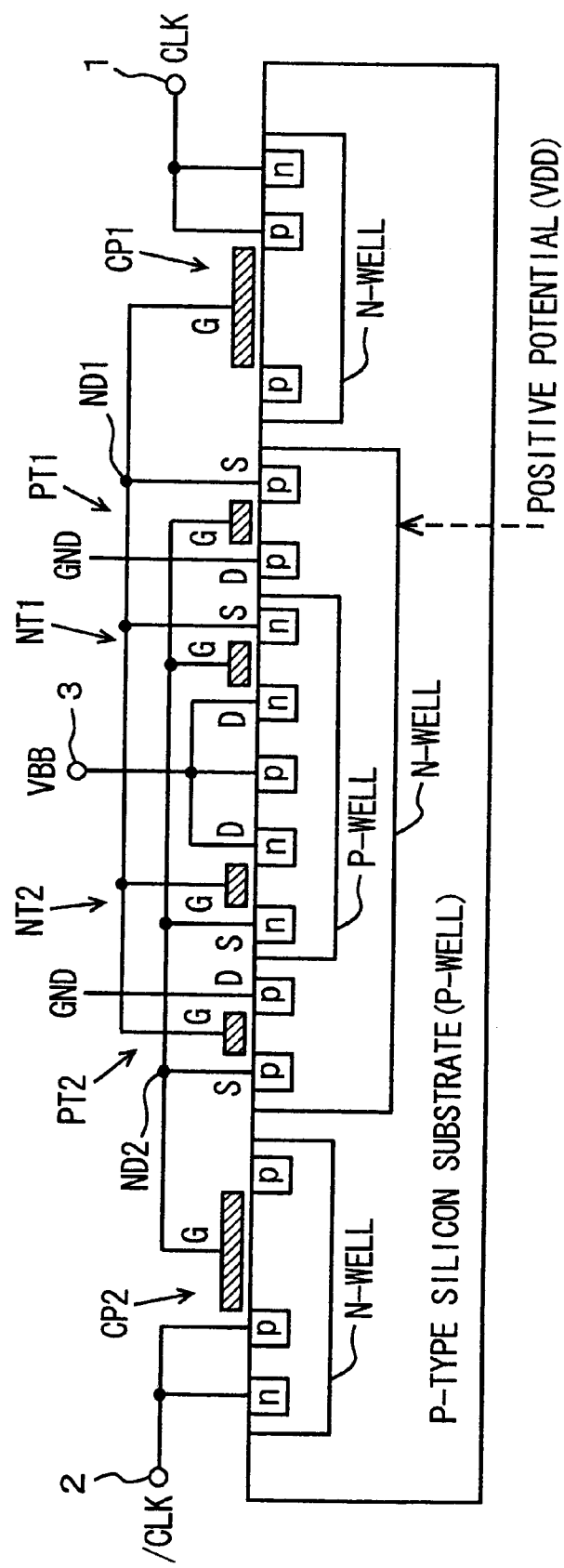
FIG. 16 is a sectional view showing an exemplary structure of a modification of the voltage generation circuit shown in FIG. 9 formed on a triple well structure.

The aforementioned third embodiment can also be carried out in the following modes:

(1) While the clock signals CLK and /CLK are applied to the N-type wells formed with the p-channel MOS transistors PT1 and PT2 for obtaining the back gate potentials thereof in the aforementioned third embodiment, the present invention is not restricted to this. Alternatively, a positive potential such as a power supply voltage VDD, for example, may be applied to the N-type wells as shown in FIG. 16, in order to obtain the back gate potentials of the transistors PT1 and PT2. FIG. 17 shows an equivalent circuit of this case.

Figure 18:
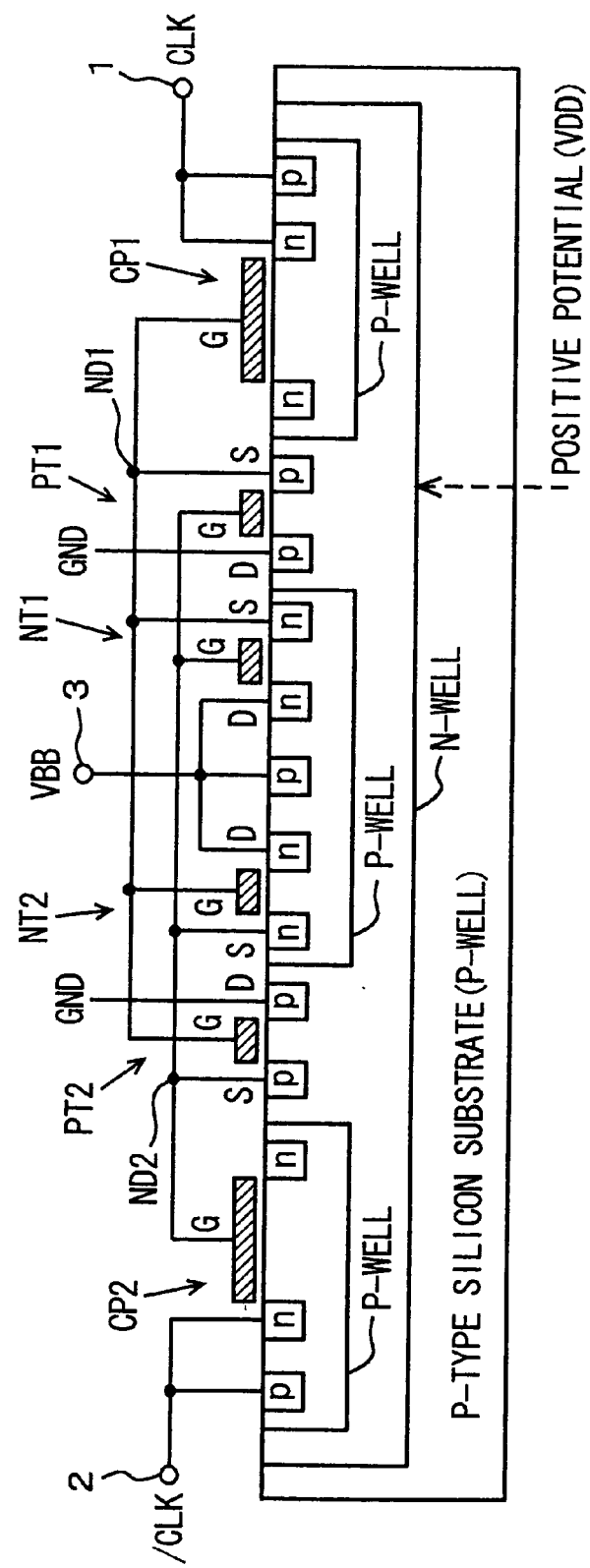
FIG. 18 is a sectional view showing an exemplary structure of another modification of the voltage generation circuit shown in FIG. 9 formed on a triple well structure.

(2) While the capacitors CP1 and CP2 are formed by the p-channel transistors separately formed on the N-type wells in the aforementioned third embodiment, the present invention is not restricted to this. Alternatively, the capacitors CP1 and CP2 may be formed by n-channel transistors separately formed on P-type wells as shown in FIG. 18, for example. FIG. 19 shows an equivalent circuit of this case.

Figure 20:
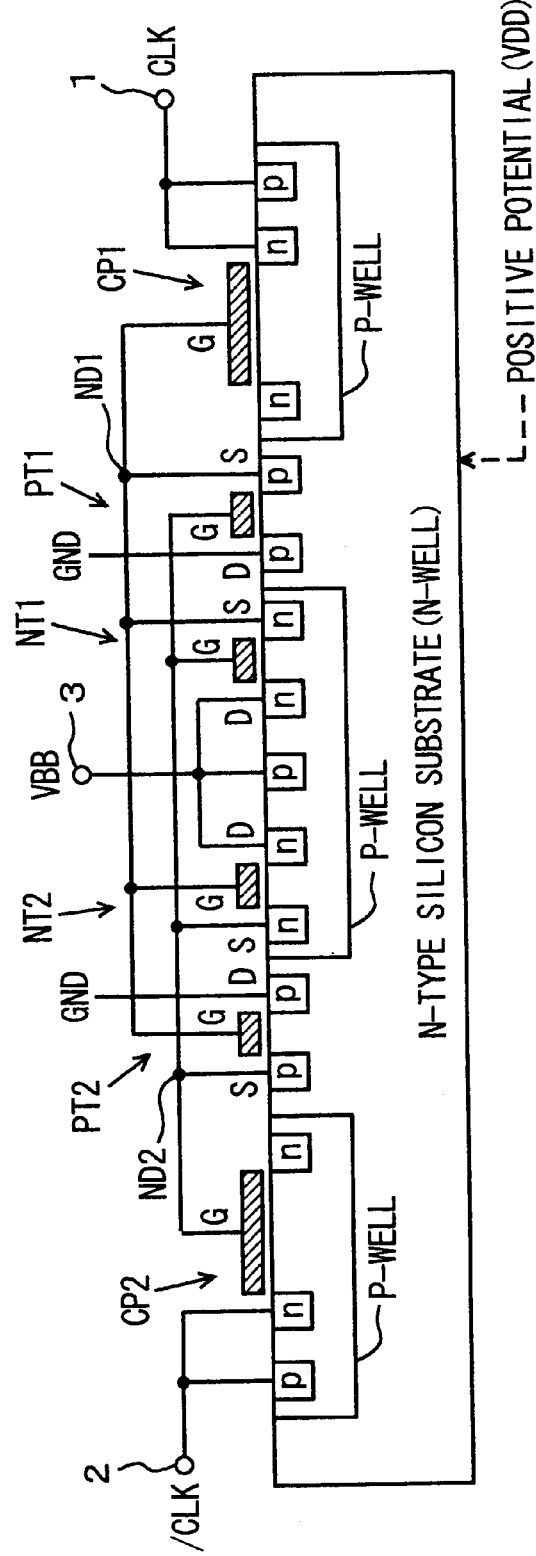
FIG. 20 is a sectional view showing an exemplary structure of the voltage generation circuit shown in FIG. 9 formed on a double well structure.

(3) While the voltage generation circuit is formed on the P-type silicon substrate having a triple well structure in the aforementioned third embodiment, the present invention is not particularly restricted to this. Alternatively, the voltage generation circuit may be formed on an N-type silicon substrate having a double well structure of an N-type well and P-type wells as shown in FIG. 20, for example.

Figure 21:
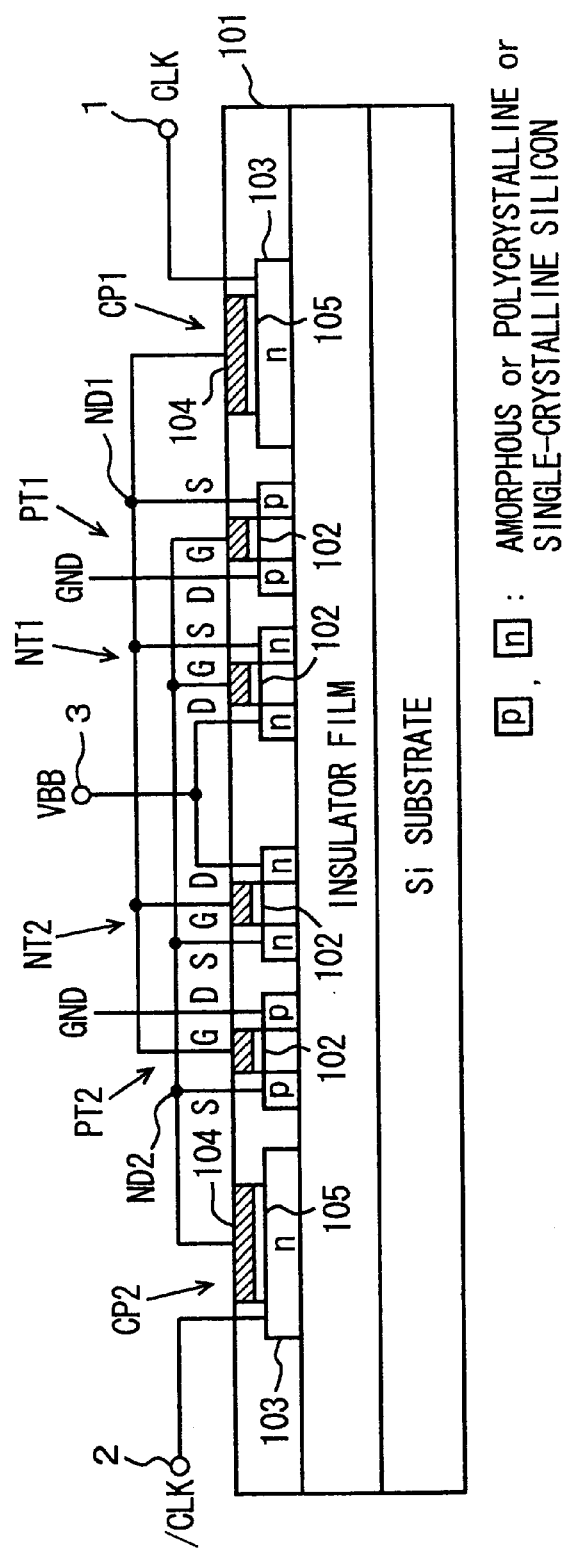
FIG. 21 is a sectional view showing an exemplary structure of the voltage generation circuit shown in FIG. 9 formed on an insulator film provided on a silicon substrate.

(4) The aforementioned voltage generation circuit may alternatively be formed on an insulator film formed on a silicon substrate, as shown in FIG. 21. In this case, each active layer (source/drain region) of the n-channel MOS transistors NT1 and NT2 and the p-channel MOS transistors PT1 and PT2 is formed from a semiconductor layer of single-crystalline silicon, polycrystalline silicon or amorphous silicon located in an interlayer isolation film 101 formed on the aforementioned insulator film.

The capacitors CP1 and CP2 are also formed on the insulator film formed on the aforementioned silicon substrate, and at least single electrodes (lower electrodes 103 in FIG. 21) thereof are formed by n-type regions or p-type regions (n-type regions in FIG. 21) formed on parts of the aforementioned semiconductor layer. Further, dielectric films 105 of the capacitors CP1 and CP2 are formed by the same insulating films, such as silicon oxide films, for example, as gate electrode oxide films 102 of the aforementioned transistor NT1, PT1, NT2 and PT2, for example.

Figure 22:
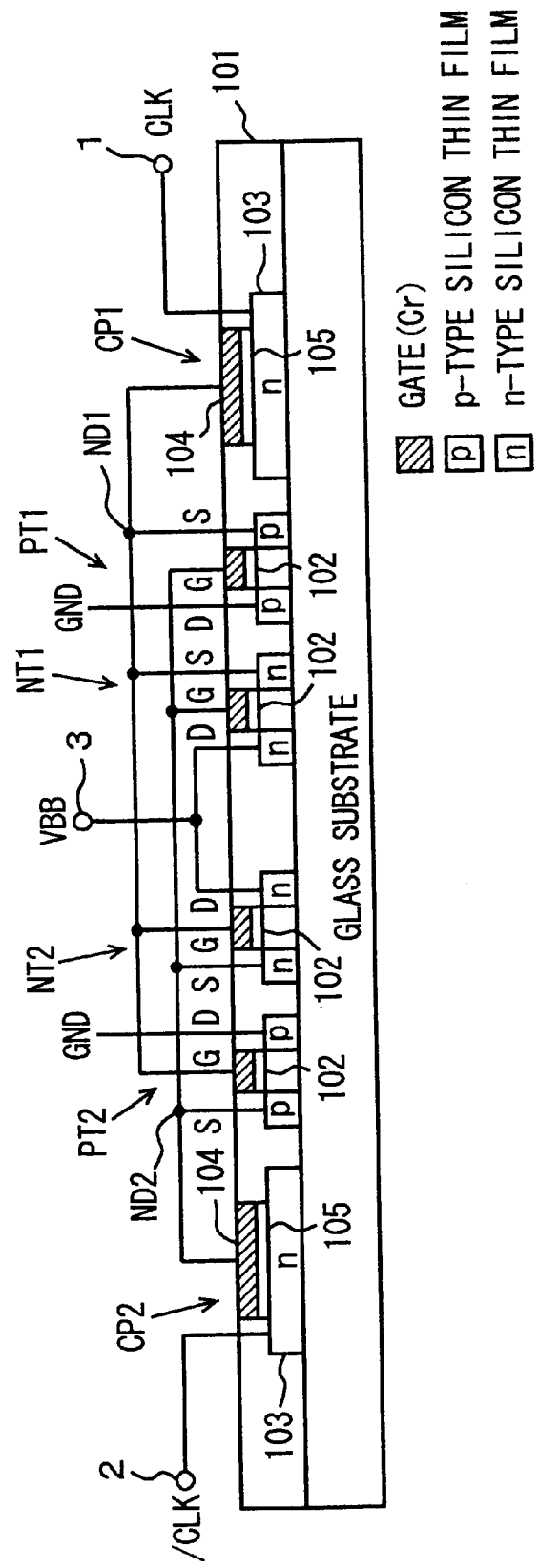
FIG. 22 is a sectional view showing an exemplary structure of the voltage generation circuit shown in FIG. 9 formed on a glass substrate.

(5) The aforementioned voltage generation circuit may be formed on a glass substrate, as shown in FIG. 22. In this case, each active layer (source/drain region) of the n-channel MOS transistors NT1 and NT2 and the p-channel MOS transistors PT1 and PT2 is formed from a semiconductor layer of polycrystalline silicon or amorphous silicon located in an interlayer isolation film 101 formed on the aforementioned glass substrate, similarly to FIG. 6. Further, each gate electrode G of the transistors NT1, NT2, PT1 and PT2 is formed by a thin film of metal chromium (Cr), for example. Alternatively, the gate electrode G may be formed by a silicide thin film or the like.

The capacitors CP1 and CP2 are also formed on the aforementioned glass substrate, and at least single electrodes (lower electrodes 103 in FIG. 22) thereof are formed by n-type regions or p-type regions (n-type regions in FIG. 22) formed in parts of the aforementioned semiconductor layer, and upper electrodes 104 are formed by the aforementioned thin film of metal chromium (Cr). Further, dielectric films 105 of the capacitors CP1 and CP2 are formed by the same insulator films, e.g., silicon oxide films, as gate electrode oxide films 102 of the transistors NT1, NT2, PT1 and PT2, for example.

Figure 23:
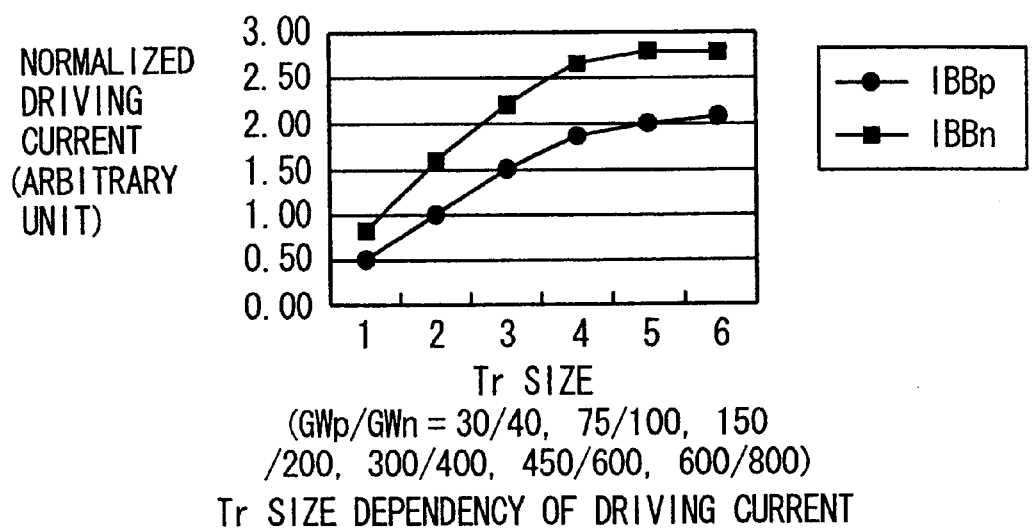
FIG. 23 is a graph showing electric characteristics of the voltage generation circuit shown in FIG. 22 and a conventional voltage generation circuit in comparison with each other.
Figure 24:
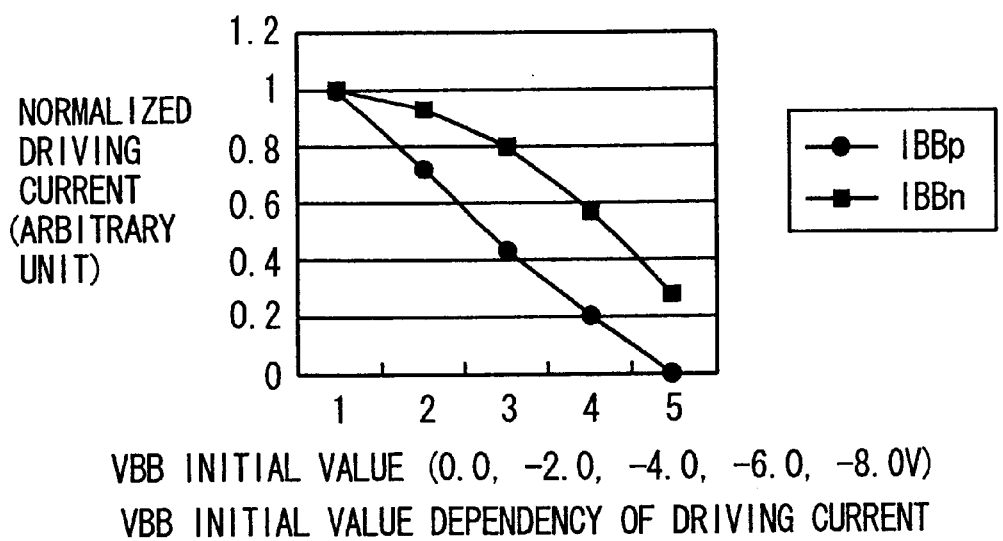
FIG. 24 is a graph showing other electric characteristics of the voltage generation circuit shown in FIG. 22 and the conventional voltage generation circuit in comparison with each other.

FIGS. 23 and 24 show the differences between the current driving characteristics of the voltage generation circuit according to this embodiment formed on the glass substrate as described above and the conventional voltage generation circuit shown in FIG. 42. Referring to FIGS. 23 and 24, "IBBp" denotes a driving current by the aforementioned conventional voltage generation circuit, and "IBBn" denotes a driving current by the voltage generation circuit according to this embodiment. In this case, the transistors are formed on the glass substrate as polycrystalline silicon thin film transistors.

FIG. 23 shows the results of simulation of the values of the driving currents flowing from the voltage output terminals 3 and 30 to the ground terminals (GND) when setting capacitance of the capacitors identical while varying the sizes of the driving transistors. In this simulation, a power supply voltage of 12 V, a rule of 5 μm, the room temperature and the like are employed as parameters.

It is understood from FIG. 23 that the n-channel MOS transistors employed as driving transistors are superior in current drivability and layout area for obtaining the same driving current to the p-channel MOS transistors.

FIG. 24 shows results of simulation of values of driving currents when setting the transistor sizes and the aforementioned parameters identical while varying the initial voltage values (VBB) of the voltage output terminals 3 and 30, similarly to FIG. 14.

It is understood from FIG. 24 that the drivability of the p-channel MOS transistors is reduced as compared with the n-channel MOS transistors as the voltage VBB of the voltage output terminal is rendered negative also when the voltage generation circuit is formed on the glass substrate. This indicates the superiority of the drivability of the n-channel MOS transistors at the prescribed negative voltage VBB.

Figure 25:
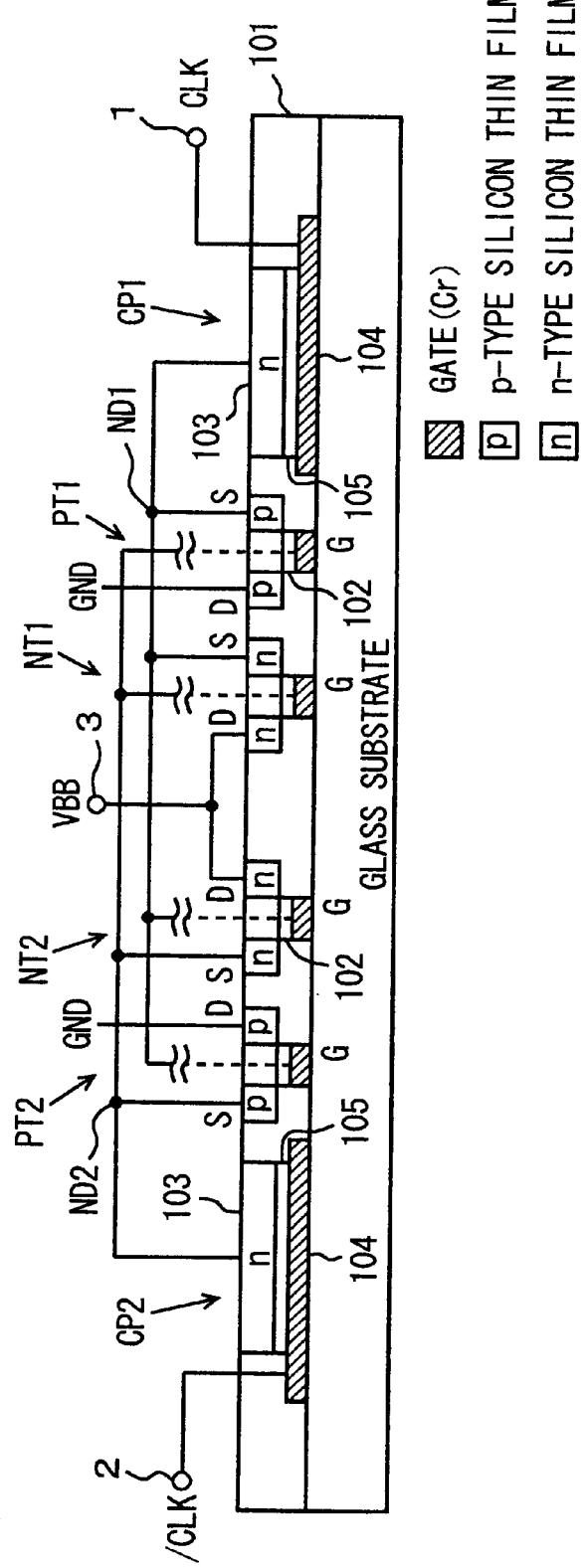
FIG. 25 is a sectional view showing another exemplary structure of the voltage generation circuit shown in FIG. 9 formed on a glass substrate.

(6) The voltage generation circuit may be formed on a glass substrate and the n-channel MOS transistors NT1 and NT2 and the p-channel MOS transistors PT1 and PT2 may be formed by not the top gate transistors shown in FIG. 22 but by bottom gate transistors, as shown in FIG. 25.

(7) While the pair of clock signals CLK and /CLK applied to the voltage generation circuit are inverted in phase to each other as shown at (a) and (b) in FIG. 10, the present invention is not restricted to this. For example, a pair of clock signals PCLK1 and PCLK2 shown in FIG. 26 may be separately formed and input in the clock input terminals 1 and 2 respectively.

Figure 26:
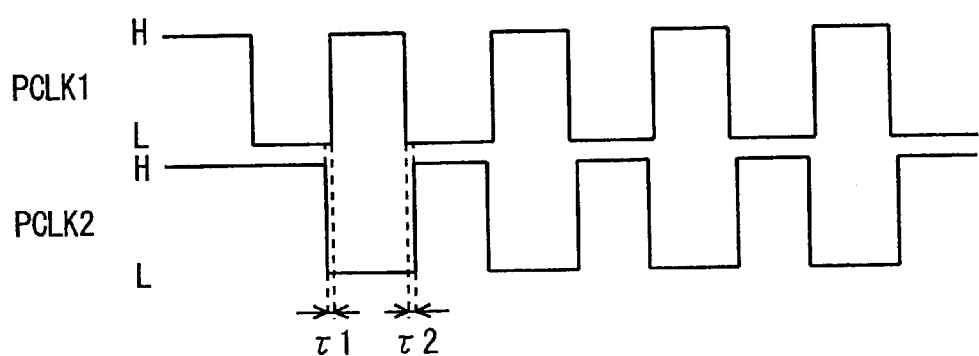
FIG. 26 is a timing chart showing modifications of clock signals applied to the voltage generation circuit shown in FIG. 9.

The pair of clock signals PCLK1 and PCLK2 are formed to have periods τ1 and τ2 when both of the clock signals PCLK1 and PCLK2 go low in logic in phase inversion from high logical levels to low logical levels, as shown in FIG. 26.

Thus, due to the periods τ1 and τ2 when both of the clock signals PCLK1 and PCLK2 go low, the aforementioned nodes ND1 and ND2 can be set to positive voltages after reliably turning off the driving transistors or the like, for example. Therefore, the negative voltage can be efficiently generated. The clock signals PCLK1 and PCLK2 may be individually formed or may be formed from a single clock signal source.

Figure 27:
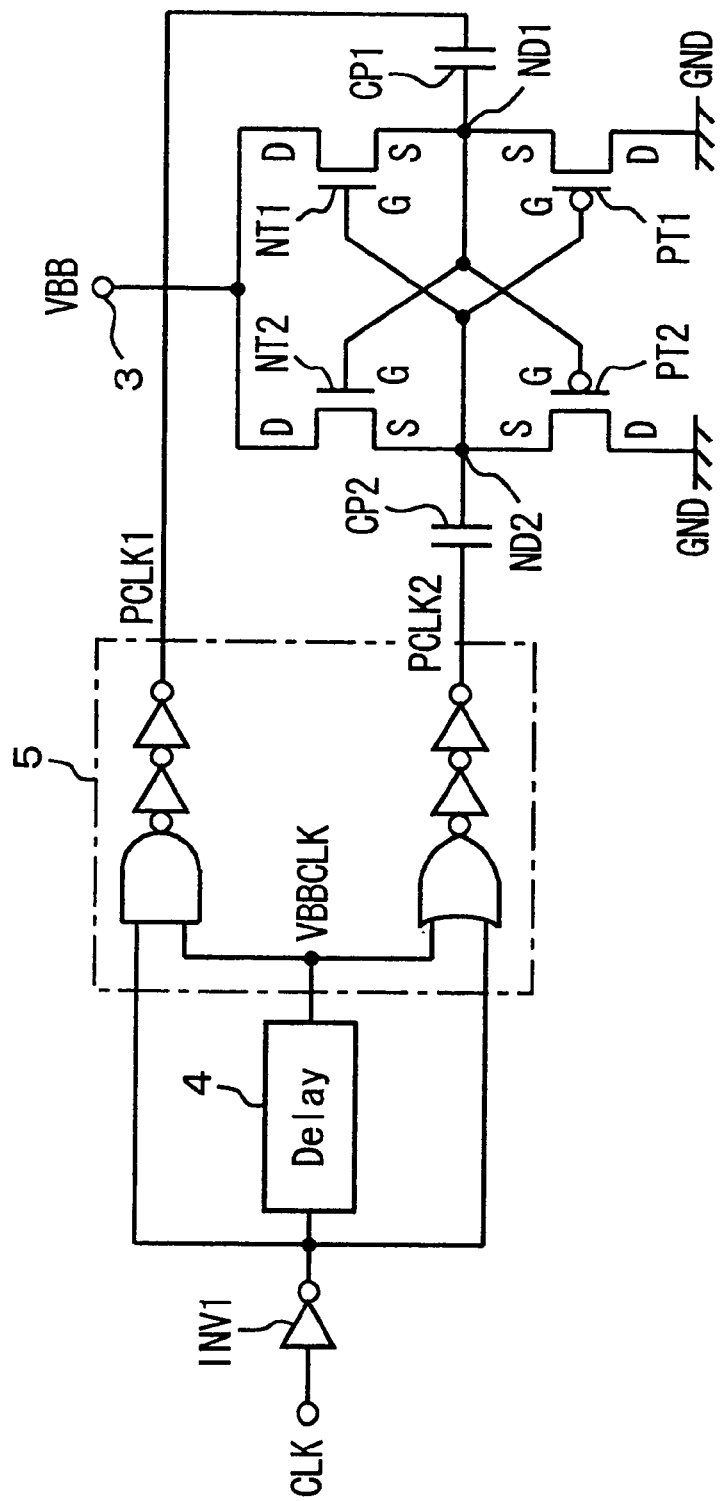
FIG. 27 is a circuit diagram showing the structure of an exemplary circuit automatically producing the clock signals shown in FIG. 26.

FIG. 27 shows an example of forming the clock signals PCLK1 and PCLK2 from a single clock signal source. In this case, a clock signal CLK is applied to a logic circuit 5 for forming the clock signals PCLK1 and PCLK2 inverted in phase to each other and a delay circuit 4 adjusting a period so that the two clock signals PCLK1 and PCLK2 have the aforementioned periods τ1 and τ2 when both of the clock signals PCLK1 and PCLK2 go low through an inverter circuit INV1, for readily and automatically producing the clock signals PCLK1 and PCLK2 shown in FIG. 26.

(Fourth Embodiment)

A voltage generation circuit according to a fourth embodiment of the present invention is now described with reference to FIGS. 28 to 31. The voltage generation circuit according to the fourth embodiment is described mainly with reference to a point different from the voltage generation circuit according to the first embodiment shown in FIG. 1, and elements of the fourth embodiment identical to those of the voltage generation circuit shown in FIG. 1 are denoted by the same reference numerals, to omit redundant description.

The structural difference between the fourth embodiment and the first embodiment resides in the following point: In the voltage generation circuit according to this embodiment, the p-channel transistor shown in FIG. 1 is changed to an n-channel MOS transistor. More specifically, the p-channel MOS transistor PT1 shown in FIG. 1 is replaced with an n-channel MOS transistor NT2, as shown in FIG. 28.

Figure 28:
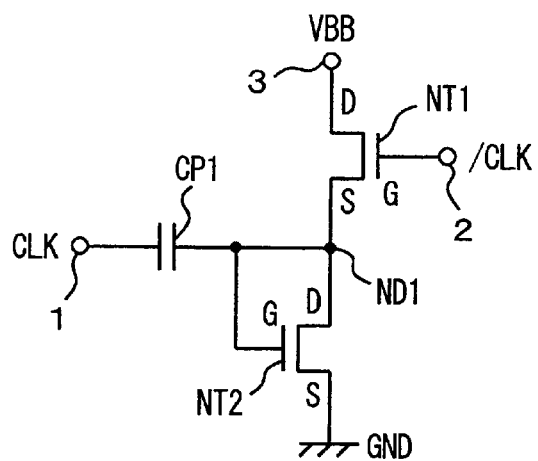
FIG. 28 is a circuit diagram showing the basic circuit structure of a voltage generation circuit according to a fourth embodiment of the present invention.

The voltage generation circuit shown in FIG. 28 comprises a capacitor CP1, a first n-channel MOS transistor NT1, the second n-channel MOS transistor NT2 and the like.

The first n-channel MOS transistor (driving transistor) NT1 has a source terminal S connected to a node ND1, a drain terminal D defining a voltage output terminal 3 outputting a negative voltage VBB and a gate terminal G connected to a clock input terminal 2. The second n-channel MOS transistor NT2 has a drain terminal D and a gate terminal G connected to the node ND1 and a source terminal S defining a ground terminal (reference potential terminal).

The capacitor CP1 has a first electrode connected to the node ND1 and a second electrode connected to a clock input terminal 1. Clock signals CLK and /CLK inverted in phase to each other are applied to the clock input terminals 1 and 2 respectively. The capacitor CP1 may be formed by an n-channel MOS transistor or a p-channel MOS transistor having a source terminal and a drain terminal connected in common.

The outline of operation of generating the negative voltage from the voltage generation circuit having the aforementioned structure is now described with reference to FIG. 29. The clock signals CLK and /CLK shown at (a) and (b) in FIG. 29 are merely inverted in phase to each other.

Figure 29:
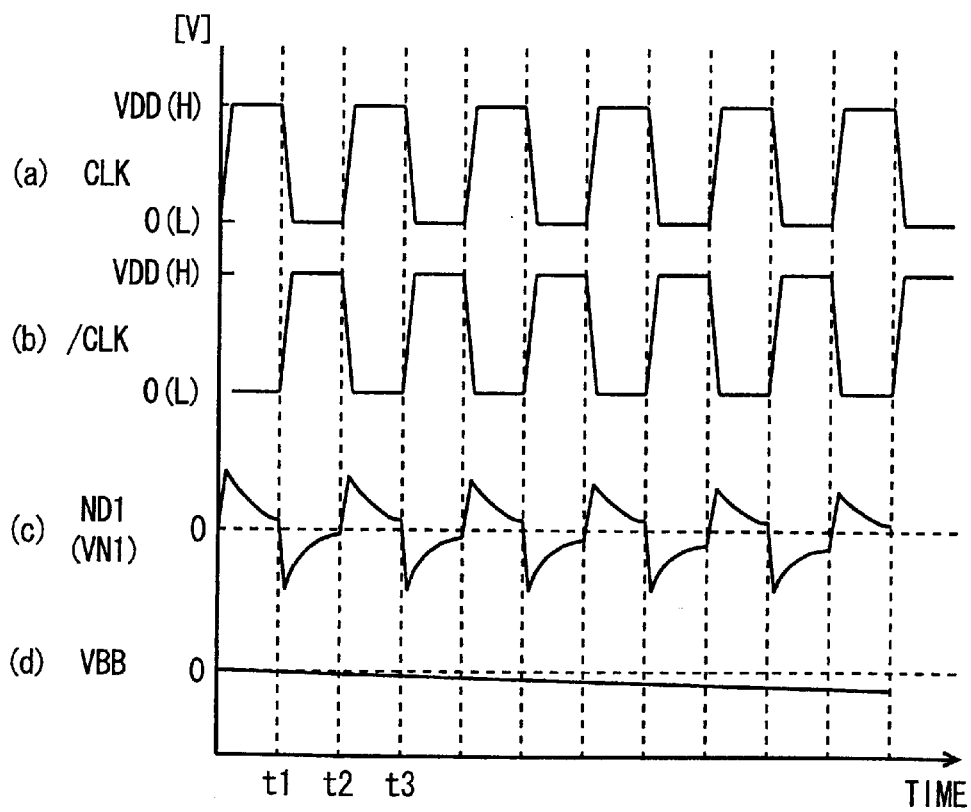
FIG. 29 is a timing chart for illustrating operation of the voltage generation circuit shown in FIG. 28.

When the clock signal CLK starts to go low (0 V) at a time t1 shown in FIG. 29, the potential VN1 of the node ND1 lowers to reach a negative voltage (see (a) and (c) in FIG. 29). When the clock signal /CLK goes high (VDD), the first n-channel MOS transistor NT1 is turned on, and charges proportional to the capacitance of the capacitor C1 flow from the drain terminal D of the n-channel MOS transistor NT1 toward the node ND1. These charges are stored in the capacitor CP1 since the second n-channel MOS transistor NT2 is in an OFF state, and the potential VN1 of the node ND1 rises in response thereto (see (c) in FIG. 29).

When the clock signal CLK starts to go high at a time t2, the potential VN1 of the node ND1 is pulled up by a level corresponding to the high level (VDD) of the clock signal CLK and further rises. When the clock signal CLK goes high, the second n-channel MOS transistor NT2 is turned on. Therefore, the charges stored in the capacitor CP1 are extracted to the ground terminal (GND), followed by reduction of the potential VN1 of the node ND1 (see (c) in FIG. 29).

When the clock signal CLK starts to go low again at a time t3, operation similar to that at the aforementioned time t1 is performed. The aforementioned operation is so repeated as to pump the charges from the drain terminal D of the first n-channel MOS transistor NT1 to the ground terminal every cycle of the clock signals CLK and /CLK, for rendering the voltage VBB of the drain terminal D of the first n-channel MOS transistor NT1 negative (see (d) in FIG. 29).

Also when the output negative voltage VBB lowers in the voltage generation circuit according to this embodiment, the potential difference between the source terminal S and the gate terminal G for turning on the first n-channel MOS transistor NT1 is supplied by the clock signal /CLK and hence drivability of the first n-channel MOS transistor NT1 can be sufficiently guaranteed regardless of the value of the output negative voltage VBB, similarly to the voltage generation circuit according to the first embodiment.

Further, the n-channel transistor is employed as the driving transistor, whereby the operating speed can be increased as compared with the case of employing the p-channel transistor as the driving transistor due to its characteristics, and the drivability can be improved. When securing ability equivalent to that of the p-channel transistor with the n-channel transistor, the element areas of the transistors can be reduced.

The outline of the sectional structure of the voltage generation circuit according to this embodiment formed on a semiconductor substrate is now described with reference to FIG. 30. FIG. 31 shows an equivalent circuit of this case.

Figure 30:
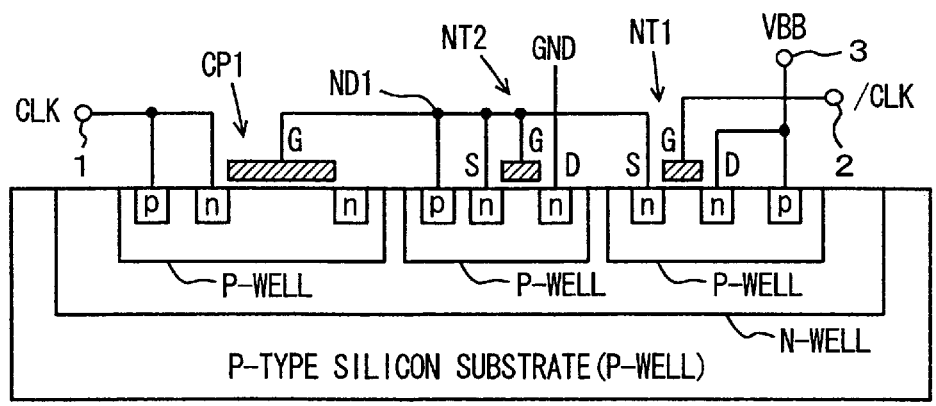
FIG. 30 is a sectional view showing an exemplary structure of the voltage generation circuit shown in FIG. 28 formed on a triple well structure.
Figure 31:
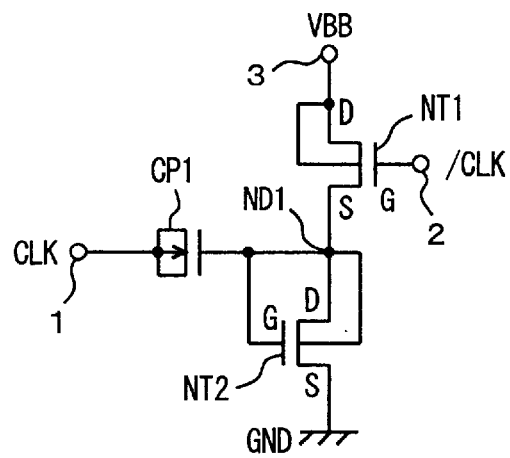
FIG. 31 is a circuit diagram showing the structure of an equivalent circuit of the voltage generation circuit corresponding to the exemplary structure shown in FIG. 30.

As shown in FIG. 30, the voltage generation circuit is formed on a P-type silicon substrate having a triple well structure formed by P-type wells, an N-type well and a P-type well.

The first n-channel MOS transistor NT1 is formed on the P-type well as a MOSFET, and the drain terminal D (the voltage output terminal 3) is connected to this P-type well for obtaining its back gate potential.

The second n-channel MOS transistor NT2 is formed on the P-type well as a MOSFET, and the node ND1 is connected to this P-type well for obtaining its back gate potential.

The capacitor CP1 is separately formed on the P-type well as an n-channel MOSFET having a source terminal and a drain terminal connected in common, and its gate terminal G is connected to the node ND1.

The voltage generation circuit according to this embodiment can also generate the negative voltage equivalent to that of the voltage generation circuit according to the first embodiment for attaining similar effects due to the aforementioned structure.

Figure 32:
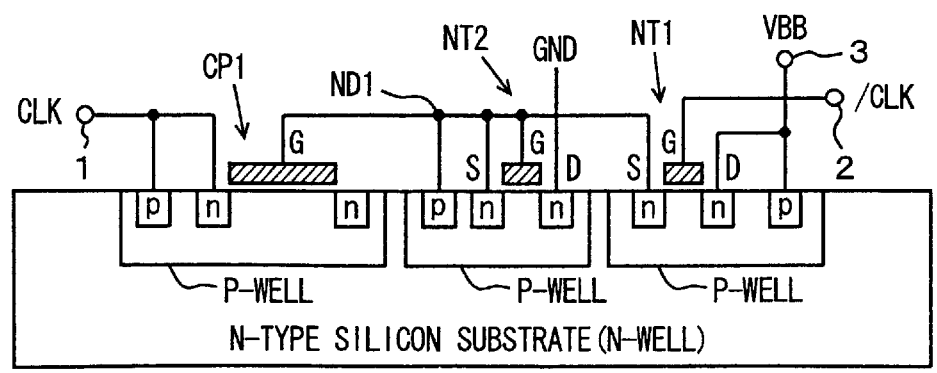
FIG. 32 is a sectional view showing an exemplary structure of a modification of the voltage generation circuit shown in FIG. 28 formed on a double well structure.

The aforementioned fourth embodiment can also be carried out in the following modes:

(1) While the voltage generation circuit is formed on the P-type silicon substrate having a triple well structure, the present invention is not particularly restricted to this. For example, the aforementioned voltage generation circuit may be formed on an N-type silicon substrate having a double well structure of an N-type well and P-type wells, as shown in FIG. 32.

Figure 33:
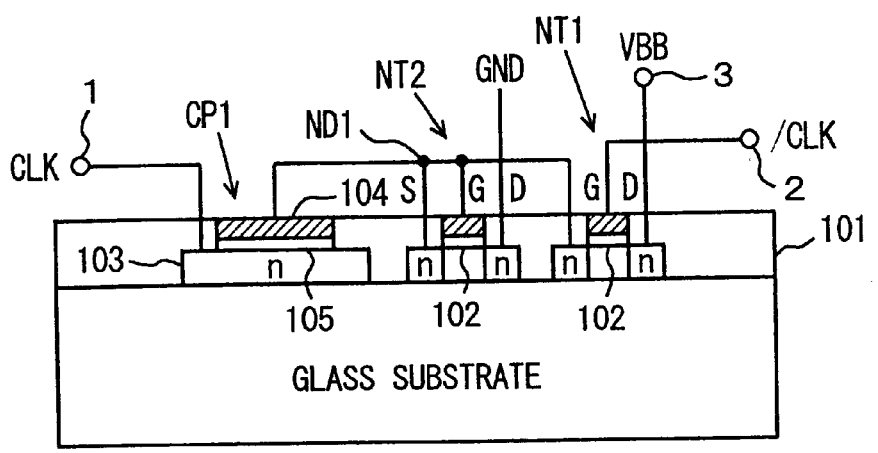
FIG. 33 is a sectional view showing an exemplary structure of the voltage generation circuit shown in FIG. 28 formed on a glass substrate.

(2) The aforementioned voltage generation circuit may be formed on a glass substrate, as shown in FIG. 33. In this case, each active layer (source/drain region) of the first and second n-channel MOS transistors NT1 and NT2 is formed from a semiconductor layer of polycrystalline silicon or amorphous silicon located in an interlayer isolation film 101 formed on the glass substrate. Further, each gate electrode G of the transistors NT1 and NT2 is formed by a thin film of metal chromium (Cr), for example. Alternatively, the gate electrode G may be formed by a silicide thin film.

The capacitor CP1 is also formed on the aforementioned glass substrate, and at least one electrode (a lower electrode 103 in FIG. 33) is formed by an n-type region formed on part of the aforementioned semiconductor layer, and its upper electrode 104 is formed by the aforementioned thin film of metal chromium (Cr), for example. A dielectric film 105 of the capacitor CP1 is formed by the same insulator film, such as a silicon oxide film, for example, as each gate electrode oxide film 102 of the aforementioned transistors NT1 and NT2.

(3) The voltage generation circuit may be formed on an insulator film formed on a silicon substrate, similarly to FIG. 21.

(4) The clock signals PCLK1 and PCLK2 having the periods τ1 and τ2 when both of the clock signals PCLK1 and PCLK2 go low in logic in phase inversion may be employed as the clock signals CLK and /CLK, as shown in FIG. 26.

(Fifth Embodiment)

A voltage generation circuit according to a fifth embodiment of the present invention is now described with reference to FIGS. 34 to 37. The voltage generation circuit according to the fifth embodiment is described mainly with reference to a point different from the voltage generation circuit according to the third embodiment shown in FIG. 9, and elements of the fifth embodiment identical to those of the voltage generation circuit shown in FIG. 9 are denoted by the same reference numerals, to omit redundant description.

Figure 34:
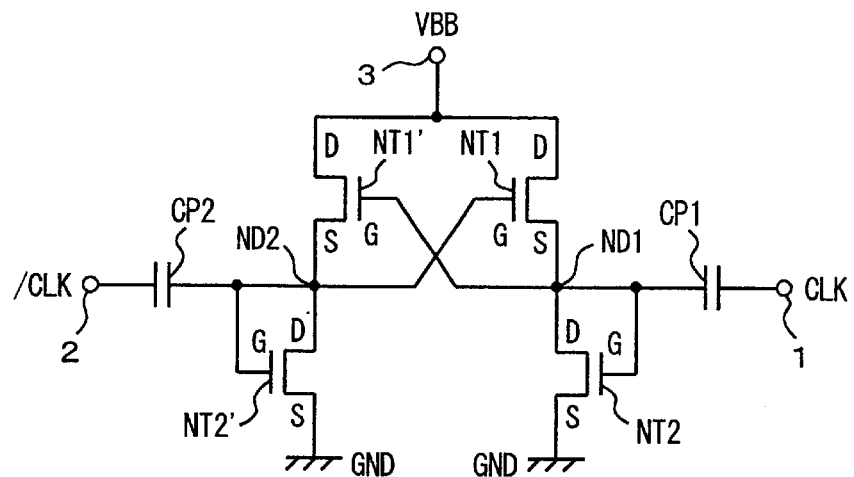
FIG. 34 is a circuit diagram showing the basic circuit structure of a voltage generation circuit according to a fifth embodiment of the present invention.

The structural difference between the fifth embodiment and the third embodiment resides in the following point: As shown in FIG. 34, the p-channel MOS transistors in the third embodiment are replaced with n-channel MOS transistors in the voltage generation circuit according to this embodiment. More specifically, the p-channel MOS transistors PT1 and PT2 shown in FIG. 9 are replaced with n-channel MOS transistors NT2 and NT2' shown in FIG. 34.

The voltage generation circuit shown in FIG. 34 comprises two pairs of transistors NT1, NT2, NT1' and NT2', while the first n-channel MOS transistors NT1 and NT1' have source terminals S connected to nodes ND1 and ND2 respectively and drain terminals D connected in common for defining a voltage output terminal 3 outputting a negative voltage VBB. The second n-channel MOS transistors NT2 and NT2' have drain terminals D connected to the nodes ND1 and ND2 respectively and source terminals S defining ground terminals (reference potential terminals).

Gate terminals G of the first and second n-channel MOS transistors NT1 and NT2' are connected to the node ND2, while gate terminals G of the first and second n-channel MOS transistors NT1' and NT2 are connected to the node ND1.

The outline of operation of generating the negative voltage from the voltage generation circuit having the aforementioned structure is now described with reference to FIG. 35.

Figure 35:
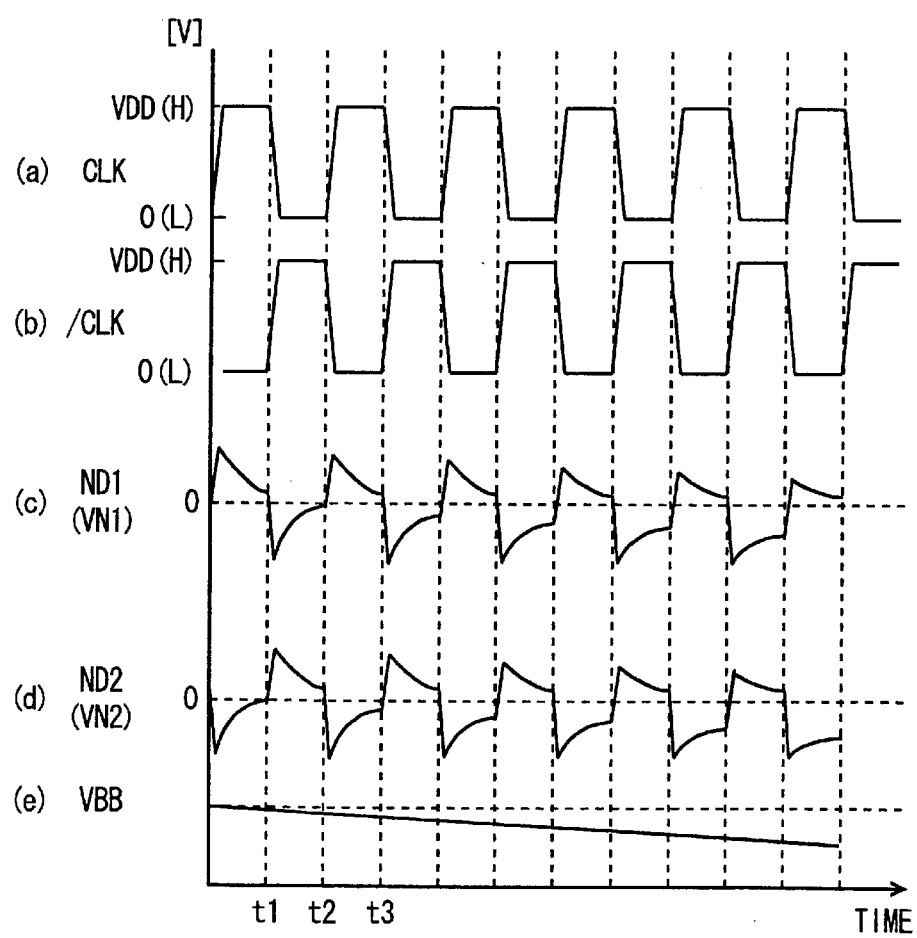
FIG. 35 is a timing chart for illustrating operation of the voltage generation circuit shown in FIG. 34.

When a clock signal CLK starts to go low (0 V) at a time t1 shown in FIG. 35, the potential VN1 of the node ND1 lowers to reach a negative voltage (see (a) and (c) in FIG. 35), while the first n-channel MOS transistor NT1' makes transition to an OFF state and the second n-channel MOS transistor NT2' makes transition to an ON state in response thereto.

When a clock signal /CLK starts to go high (VDD), the potential VN2 of the node ND2 is pulled up by a level corresponding to the high level (VDD) of the clock signal /CLK (see (b) and (d) in FIG. 35) and rises, while the first n-channel MOS transistor NT1 makes transition to an ON state and the second n-channel MOS transistor NT2 makes transition to an OFF state in response thereto.

At this time, the second n-channel MOS transistor NT2' is turned on, whereby charges stored in the capacitor CP2 are extracted to the ground terminal (GND), and the potential VN2 of the node ND2 lowers in response thereto (see (d) in FIG. 35).

Due to the transition of the first n-channel MOS transistor NT1 to the ON state, charges proportional to the capacitance of the capacitor C1 flow from the drain terminal D of the first n-channel MOS transistor NT1 toward the node ND1. These charges are stored in the capacitor CP1 since the second n-channel MOS transistor NT2 is in an OFF state, and the potential VN1 of the node ND1 rises in response thereto (see (c) in FIG. 35).

Then, the clock signal CLK starts to go high and the clock signal /CLK starts to go low at a time t2, whereby the pairs of transistors perform operation reverse to that at the aforementioned time t1.

When the clock signal CLK starts to go high H at the time t2, the potential VN1 of the node ND1 is pulled up by a level corresponding to the high level (VDD) of the clock signal CLK and rises (see (a) and (c) in FIG. 35), while the first n-channel MOS transistor NT1' makes transition to an ON state and the second n-channel MOS transistor NT2' makes transition to an OFF state in response thereto.

When the clock signal /CLK starts to go low, the potential VN2 of the node N2 lowers to a negative voltage (see (b) and (d) in FIG. 35) while the first n-channel MOS transistor NT1 makes transition to an OFF state and the second n-channel MOS transistor NT2 makes transition to an ON state in response thereto.

At this time, the second n-channel MOS transistor NT2 is turned on, whereby the charges stored in the capacitor CP1 are extracted to the ground terminal (GND), followed by reduction of the potential VN1 of the node ND1 (see (c) in FIG. 35).

Further, the first n-channel MOS transistor NT1' is turned on, whereby charges proportional to the capacitance of the capacitor CP2 flow from the drain terminal D of the first n-channel MOS transistor NT1' toward the node ND2. These charges are stored in the capacitor CP2 since the second n-channel MOS transistor NT2' is in the OFF state, and the potential VN2 of the node ND2 rises in response thereto (see (d) in FIG. 35).

When the clock signal CLK starts to go low again at a time t3, operation similar to that at the aforementioned time t1 is performed. The aforementioned operation is so repeated as to pump the charges from the drain terminal D of either the first n-channel MOS transistor NT1 or NT1' every half cycle of the clock signal CLK or /CLK, for rendering the voltage VBB of the drain terminal D negative (see (e) in FIG. 35).

Also according to the voltage generation circuit of this embodiment, pumping can be more efficiently performed by carrying out pumping operation for rendering the voltage negative every half cycle of the clock signal, and the speed for rendering the voltage negative can be increased similarly to the voltage generation circuit according to the third embodiment.

The outline of the sectional structure of the voltage generation circuit according to this embodiment formed on a semiconductor substrate is now described with reference to FIG. 36. FIG. 37 shows an equivalent circuit of this case.

Figure 36:
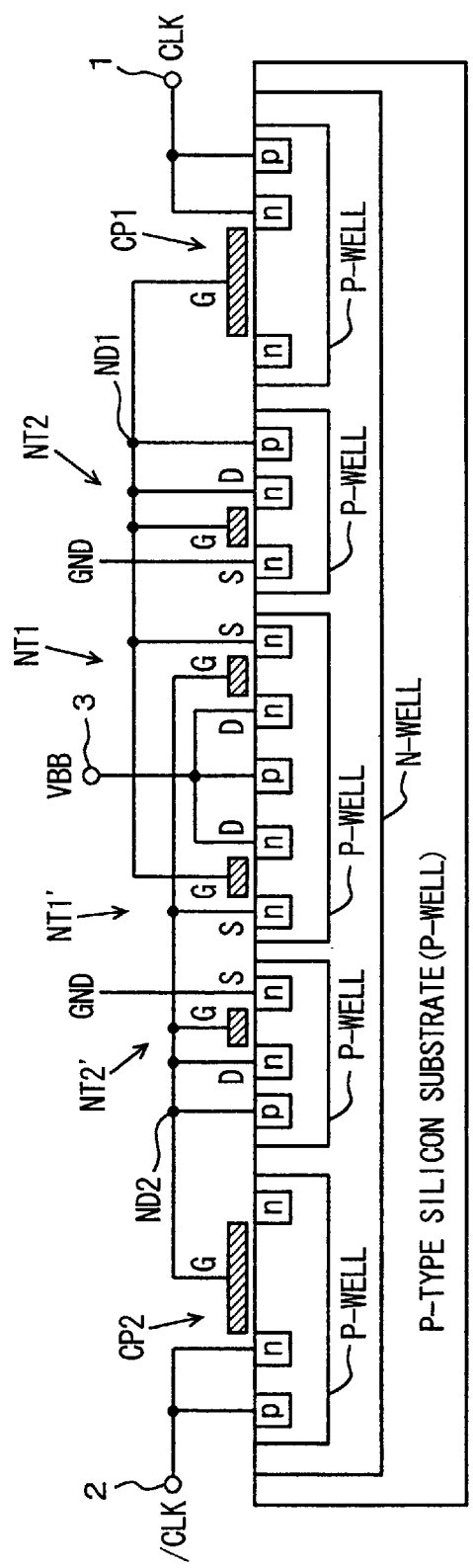
FIG. 36 is a sectional view showing an exemplary structure of the voltage generation circuit shown in FIG. 34 formed on a triple well structure.
Figure 37:
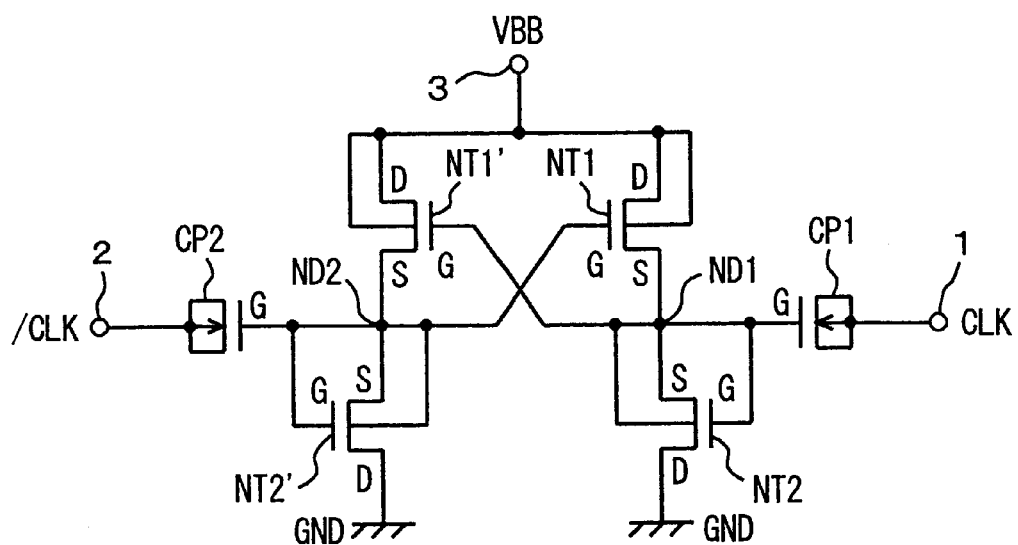
FIG. 37 is a circuit diagram showing an equivalent circuit of the voltage generation circuit corresponding to the exemplary structure shown in FIG. 36.

As shown in FIG. 36, the voltage generation circuit according to this embodiment is also formed on a P-type silicon substrate having a triple well structure of P-type wells, an N-type well and a P-type well, similarly to the voltage generation circuit according to the third embodiment.

Each of the first n-channel transistors NT1 and NT1' is formed on the P-type well as MOSFETs respectively, and the drain terminal D (the voltage output terminal 3) thereof is connected to the P-type well for obtaining back its gate potential.

The second n-channel transistor NT2 is formed on the P-type well as a MOSFET and the node ND1 is connected to this P-type well for obtaining its back gate potential, while the second n-channel transistor NT2' is formed on the P-type well as a MOSFET and the node ND2 is connected to this P-type well for obtaining its back gate potential.

The capacitor CP1 is separately formed on the P-type well as an n-channel transistor having a source terminal and a drain terminal connected in common and its gate terminal G is connected to the node ND1, while the capacitor CP2 is separately formed on the P-type well as an n-channel transistor having a source terminal and a drain terminal connected in common and its gate terminal G is connected to the node ND2.

The voltage generation circuit shown in FIG. 36 can also generate a negative voltage equivalent to that of the voltage generation circuit according to the third embodiment and attain similar effects due to the aforementioned structure.

Figure 38:
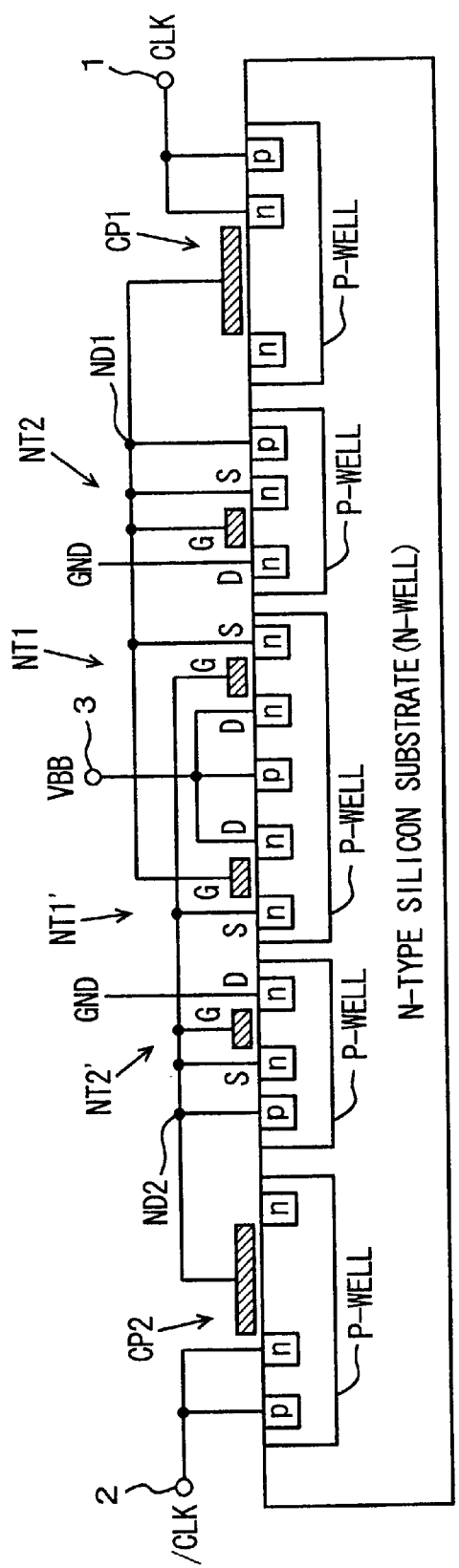
FIG. 38 is a sectional view showing an exemplary structure of the voltage generation circuit shown in FIG. 34 formed on a double well structure.

The aforementioned fifth embodiment can also be carried out in the following modes:

(1) While the voltage generation circuit according to the aforementioned fifth embodiment is formed on the P-type silicon substrate having a triple well structure, the present invention is not particularly restricted to this. For example, the voltage generation circuit may be formed on an N-type silicon substrate having a double well structure of an N-type well and P-type wells, as shown in FIG. 38.

In this case, each of the first and second n-channel MOS transistors NT1, NT2, NT1' and NT2' is formed on the N-type silicon substrate as a silicon transistor of single-crystalline silicon, polycrystalline silicon or amorphous silicon. Each of the capacitors CP1 and CP2 is formed by a silicon electrode and an insulator thin film formed on the N-type silicon substrate.

Figure 39:
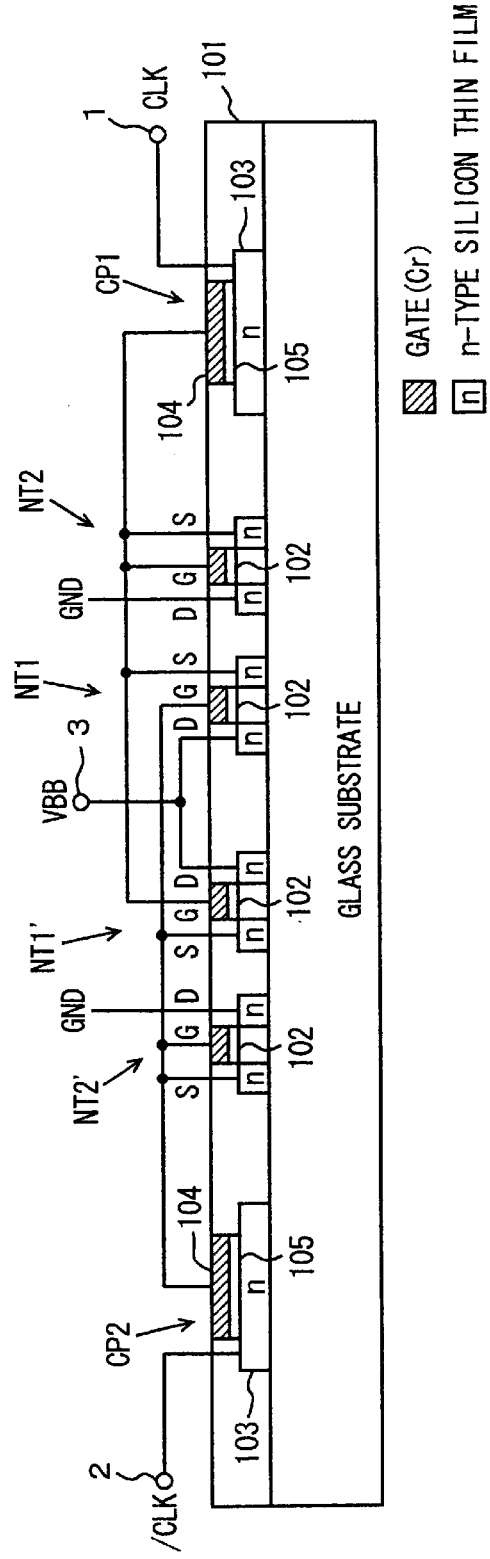
FIG. 39 is a sectional view showing an exemplary structure of the voltage generation circuit shown in FIG. 34 formed on a glass substrate.

(2) The voltage generation circuit may be formed on a glass substrate, as shown in FIG. 39. In this case, each active layer (source/drain region) of the first and second n-channel MOS transistors NT1, NT2, NT1' and NT2' is formed from a semiconductor layer of polycrystalline silicon or amorphous silicon located in an interlayer isolation film 101 formed on the glass substrate, similarly to FIG. 33. Further, each gate electrode G of the transistors NT1, NT2, NT1' and NT2' is formed by a thin film of metal chromium (Cr), for example. The gate electrode G may alternatively be formed by a silicide thin film or the like.

The capacitors CP1 and CP2 are also formed on the aforementioned glass substrate, and at least single electrodes (lower electrodes 103 in FIG. 39) are formed by n-type regions formed on parts of the aforementioned semiconductor layer, and upper electrodes 104 are formed by the aforementioned thin film of metal chromium (Cr), for example. Further, dielectric films 105 of the capacitors CP1 and CP2 are formed by the same insulator films, such as silicon oxide films, for example, as gate electrode oxide films 102 of the aforementioned transistors NT1, NT2, NT1' and NT2', for example. The aforementioned transistors NT1, NT2, NT1' and NT2' may be formed not by the top gate transistors shown in FIG. 39 but by bottom gate transistors.

(3) The voltage generation circuit may be formed on an insulator film formed on a silicon substrate, similarly to that shown in FIG. 21.

(4) Clock signals PCLK1 and PCLK2 having periods τ1 and τ2 when both of the clock signals PCLK1 and PCLK2 go low in phase inversion may be employed as the clock signals CLK and /CLK, similarly to those shown in FIG. 26.

(Embodiment of Display Unit)

Figure 40:
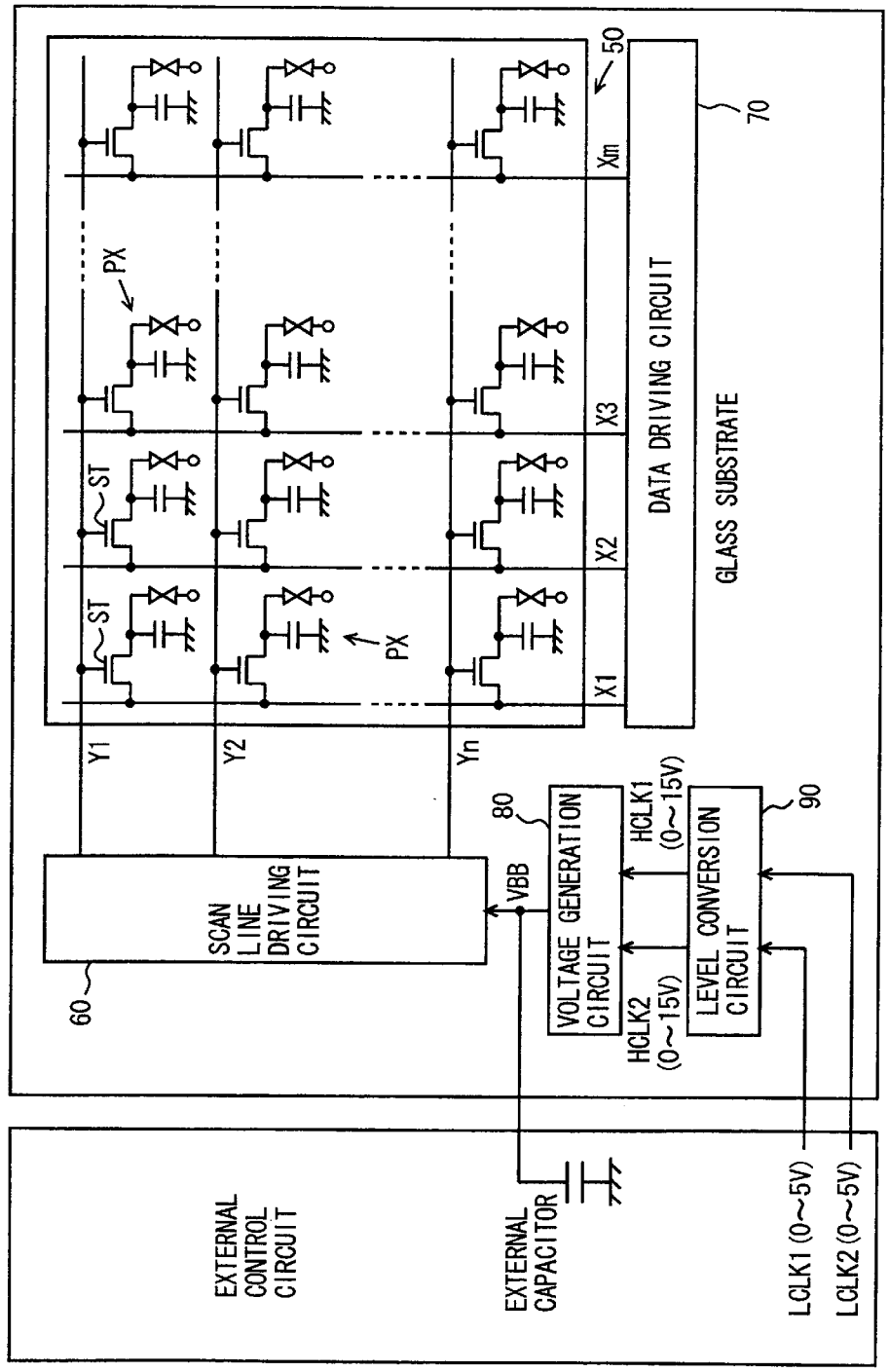
FIG. 40 is a block diagram schematically showing the structure of an embodiment of a display unit comprising the voltage generation circuit according to the present invention.
Figure 41:
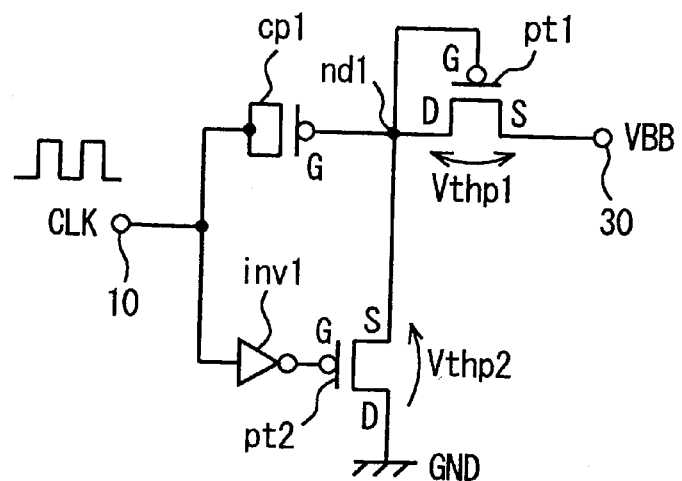
FIG. 41 is a circuit diagram showing the basic circuit structure of a conventional voltage generation circuit.

A display unit comprising the voltage generation circuit according to the present invention is now described with reference to FIG. 40. Referring to FIG. 40, the present invention is applied to a polysilicon TFT liquid crystal display unit as the display unit comprising the voltage generation circuit.

The display unit shown in FIG. 40 comprises a display part 50, a scan line driving circuit 60, a data driving circuit 70, a voltage generation circuit 80, a level conversion circuit 90 etc. formed on a glass substrate.

The display part 50 includes a plurality of display pixels PX arranged on intersections between a plurality of scan lines Y1 to Yn and a plurality of data lines X1 to Xm in the form of a matrix, active switching elements ST provided for the respective display pixels PX for controlling an applied voltage to the display pixels PX, and the like. The active switching elements ST are formed by polysilicon thin-film transistors, for example.

The scan line driving circuit 60 scans the plurality of scan lines Y1 to Yn, and applies a driving voltage for activating the active switching elements ST to the scan lines Y1 to Yn. The data driving circuit 70 outputs pixel information corresponding to the scan lines Y1 to Yn to the data lines X1 to Xm.

In this embodiment, the voltage generation circuit 80 has a circuit structure such as that shown in FIG. 9 and a sectional structure such as that shown in FIG. 22, for example, and is formed on the glass substrate. In other words, the voltage generation circuit 80, employing a pair of voltage generation circuits shown in FIG. 1, has two capacitors and generates a prescribed negative voltage through nodes connected to single terminals of the capacitors. Therefore, the voltage generation circuit 80 can efficiently perform pumping every half cycle of clock signals HCLK1 and HCLK2 (or CLK and /CLK). Respective n-channel transistors and respective p-channel transistors forming the voltage generation circuit 80 are formed on the glass substrate as polysilicon thin-film transistors.

The level conversion circuit 90 steps up/converts the levels of signals applied to the voltage generation circuit 80 as the clock signals HCLK1 and HCLK2. According to this embodiment, the level conversion circuit 90 level-converts clock signals LCLK1 and LCLK2 of 0 to 5 V to the clock signals HCLK1 and HCLK2 of 0 to 15 V, and applies the converted clock signals HCLK1 and HCLK2 to the voltage generation circuit 80, for example. Thus, the voltage generation circuit 80 can readily and efficiently generate a prescribed negative voltage VBB required in the scan line driving circuit 60 due to the level conversion of the clock signals.

Due to the aforementioned structure, the display unit comprising the voltage generation circuit according to this embodiment can attain the following effects:

(1) While a voltage from a ground potential to a power supply voltage VDD is generally applied to the scan lines Y1 to Yn, power consumption of the liquid crystal display unit can be reduced and off margins of the active switching elements ST can be increased by applying a voltage from the prescribed negative voltage to half the power supply voltage VDD due to the voltage generation circuit 80 loaded on the liquid crystal display unit.

(2) While AC-driving liquid crystal electrodes opposed to each other for reducing power consumption, by loading the voltage generation circuit 80 on the liquid crystal display unit, the gate potential of pixel transistors can be set to a lower negative potential due to the large achieved negative voltage regardless of the threshold voltage of transistors, data leak can be prevented and power consumption can be reduced.

(3) While an external capacitor is provided outside the liquid crystal display unit as an element for storing a negative voltage as shown in FIG. 40 when the negative voltage is supplied to the liquid crystal display unit, the capacitance of the external capacitor can be reduced and the external capacitor may be miniaturized or omitted by loading the voltage generation circuit 80 on the liquid crystal display unit.

(4) While the liquid crystal display unit must reach the negative voltage VBB as soon as possible upon power supply, the negative voltage VBB can be quickly supplied due to efficient pumping of the voltage generation circuit 80.

(5) The display quality of the liquid crystal display unit can be improved by loading the voltage generation circuit 80 having a large driving current (drivability) thereon.

This embodiment can also be carried out in the following modes:

(1) The voltage generation circuit loaded on the liquid crystal display unit is not particularly restricted to the voltage generation circuit 80 having the circuit structure such as that shown in FIG. 9 and the sectional structure such as that shown in FIG. 22 and formed on the glass substrate.

For example, a voltage generation circuit having a circuit structure such as that shown in FIG. 1 and a sectional structure such as that shown in FIG. 6 and formed on a glass substrate may be employed, or a voltage generation circuit having a circuit structure such as that shown in FIG. 9 and a sectional structure such as that shown in FIG. 25 and formed on a glass substrate may be employed.

Further, a voltage generation circuit having a circuit structure such as that shown in FIG. 28 and a sectional structure such as that shown in FIG. 33 may be employed, or a voltage generation circuit having a circuit structure such as that shown in FIG. 34 and a sectional structure such as that shown in FIG. 39 and formed on a glass substrate may be employed.

(2) The liquid crystal display unit comprising the voltage generation circuit according to the present invention is not particularly restricted to the aforementioned polysilicon TFT liquid crystal display unit but the present invention is also similarly applicable to an amorphous silicon TFT liquid crystal display unit or the like, for example.

(3) The display unit comprising the voltage generation circuit according to the present invention is not particularly restricted to the aforementioned liquid crystal display unit but the present invention is also similarly applicable to another display unit such as an organic EL (electroluminescence) display unit, for example.

(4) The clock signals PCLK1 and PCLK2 having the periods τ1 and τ2 when both of the clock signals PCLK1 and PCLK2 go low in logic in phase inversion as shown in FIG. 26 may be employed as the clock signals LCLK1 and LCLK2.

In addition, changeable elements common to the aforementioned embodiments are as follows: While the voltage generation circuit generates the negative voltage VBB from the voltage output terminal 3 with the reference potential of the ground potential (GND) in each of the aforementioned embodiments, the present invention is not particularly restricted to this. The present invention is also applicable to a case of setting the aforementioned reference potential to a prescribed negative voltage and generating a negative voltage lower than the prescribed negative voltage from the voltage output terminal of the voltage generation circuit, or a case of setting the reference potential to a prescribed positive voltage and generating a positive voltage or a negative voltage lower than the prescribed positive voltage from the voltage output terminal of the voltage generation circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage generation circuit having first and second capacitors and generating a prescribed voltage through first and second nodes connected to first terminals of said first and second capacitors, respectively, said voltage generation circuit comprising:

a first n-channel transistor having one of a source terminal and a drain terminal connected to said first node with the other one of said source terminal and said drain terminal defining an output terminal outputting said prescribed voltage;

a second n-channel transistor having one of a source terminal and a drain terminal connected to said second node with the other one of said source terminal and said drain terminal defining an output terminal outputting said prescribed voltage;

a first p-channel transistor having one of a source terminal and a drain terminal connected to said first node with the other one of said source terminal and said drain terminal defining a reference potential terminal; and a second p-channel transistor having one of a source terminal and a drain terminal connected to said second node with the other one of said source terminal and said drain terminal defining a reference potential terminal, wherein a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on a P-type semiconductor substrate having a triple well structure, each of said first and second n-channel transistors includes a MOSFET formed on a P-type well to which said output terminal is connected for obtaining its back gate potential, each of said first and second p-channel transistors includes a MOSFET formed on an N-type well to which said clock signal is applied for obtaining its back gate potential, said first capacitor includes a p-channel transistor separately formed on an N-type well with a source terminal and a drain terminal connected in common and a gate terminal connected to said first node, and said second capacitor includes a p-channel transistor separately formed on an N-type well with a source terminal and a drain terminal connected in common and a gate terminal connected to said second node.

2. The voltage generation circuit according to claim 1, further comprising an inverter circuit for forming said two clock signals on the basis of a single clock signal.

3. A voltage generation circuit having first and second capacitors and generating a prescribed voltage through first and second nodes connected to first terminals of said first and second capacitors, respectively, said voltage generation circuit comprising:

a first n-channel transistor having one of a source terminal and a drain terminal connected to said first node with the other one of said source terminal and said drain terminal defining an output terminal outputting said prescribed voltage;

a second n-channel transistor having one of a source terminal and a drain terminal connected to said second node with the other one of said source terminal and said drain terminal defining an output terminal outputting said prescribed voltage;

a first p-channel transistor having one of a source terminal and a drain terminal connected to said first node with the other one of said source terminal and said drain terminal defining a reference potential terminal; and a second p-channel transistor having one of a source terminal and a drain terminal connected to said second node with the other one of said source terminal and said drain terminal defining a reference potential terminal, wherein a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on a P-type semiconductor substrate having a triple well structure, each of said first and second n-channel transistors includes a MOSFET formed on a P-type well to which said output terminal is connected for obtaining its back gate potential, each of said first and second p-channel transistors includes a MOSFET formed on an N-type well to which a positive potential is applied for obtaining its back gate potential, said first capacitor includes a p-channel transistor separately formed on an N-type well with a source terminal and a drain terminal connected in common and a gate terminal connected to said first node, and said second capacitor includes a p-channel transistor separately formed on an N-type well with a source terminal and a drain terminal connected in common and a gate terminal connected to said second node.

4. A voltage generation circuit having first and second capacitors and generating a prescribed voltage through first and second nodes connected to first terminals of said first and second capacitors, respectively, said voltage generation circuit comprising:

a first n-channel transistor having one of a source terminal and a drain terminal connected to said first node with the other one of said source terminal and said drain terminal defining an output terminal outputting said prescribed voltage;

a second n-channel transistor having one of a source terminal and a drain terminal connected to said second node with the other one of said source terminal and said drain terminal defining an output terminal outputting said prescribed voltage;

a first p-channel transistor having one of a source terminal and a drain terminal connected to said first node with the other one of said source terminal and said drain terminal defining a reference potential terminal; and a second p-channel transistor having one of a source terminal and a drain terminal connected to said second node with the other one of said source terminal and said drain terminal defining a reference potential terminal, wherein a gate terminal of said first n-channel transistor and a gate terminal of said first p-channel transistor are connected in common and connected to said second node, a gate terminal of said second n-channel transistor and a sate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on a P-type semiconductor substrate having a triple well structure, each of said first and second n-channel transistors includes a MOSFET formed on a P-type well to which said output terminal is connected for obtaining its back gate potential, each of said first and second p-channel transistors includes a MOSFET formed on an N-type well to which a positive potential is applied for obtaining its back gate potential, said first capacitor includes an n-channel transistor separately formed on a P-type well with a source terminal and a drain terminal connected in common and a gate terminal connected to said first node, and said second capacitor includes an n-channel transistor separately formed on a P-type well with a source terminal and a drain terminal connected in common and a gate terminal connected to said second node.

5. A voltage generation circuit having first and second capacitors and generating a prescribed voltage through first and second nodes connected to first terminals of said first and second capacitors, respectively, said voltage generation circuit comprising:

a first n-channel transistor having one of a source terminal and a drain terminal connected to said first node with the other one of said source terminal and said drain terminal defining an output terminal outputting said prescribed voltage;

a second n-channel transistor having one of a source terminal and a drain terminal connected to said second node with the other one of said source terminal and said drain terminal defining an output terminal outputting said prescribed voltage;

a first p-channel transistor having one of a source terminal and a drain terminal connected to said first node with the other one of said source terminal and said drain terminal defining a reference potential terminal; and a second p-channel transistor having one of a source terminal and a drain terminal connected to said second node with the other one of said source terminal and said drain terminal defining a reference potential terminal, wherein a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on a P-type semiconductor substrate having a double well structure, each of said first and second n-channel transistors includes a MOSFET formed on a P-type well to which said output terminal is connected for obtaining its back gate potential, each of said first and second p-channel transistors includes a MOSFET formed on an N-type well to which a positive potential is applied for obtaining its back gate potential, said first capacitor includes an n-channel transistor separately formed on a P-type well with a source terminal and a drain terminal connected in common and a gate terminal connected to said first node, and said second capacitor includes an n-channel transistor separately formed on a P-type well with a source terminal and a drain terminal connected in common and a gate terminal connected to said second node.

6. A voltage generation circuit having first and second capacitors and generating a prescribed voltage through first and second nodes connected to first terminals of said first and second capacitors, respectively, said voltage generation circuit comprising:

a first n-channel transistor having one of a source terminal and a drain terminal connected to said first node with the other one of said source terminal and said drain terminal defining an output terminal outputting said prescribed voltage;

a second n-channel transistor having one of a source terminal and a drain terminal connected to said second node with the other one of said source terminal and said drain terminal defining an output terminal outputting said prescribed voltage;

a first p-channel transistor having one of a source terminal and a drain terminal connected to said first node with the other one of said source terminal and said drain terminal defining a reference potential terminal; and a second p-channel transistor having one of a source terminal and a drain terminal connected to said second node with the other one of said source terminal and said drain terminal defining a reference potential terminal, wherein a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on an insulator film formed on a silicon substrate, an active layer of each of said first and second n-channel transistors and said first and second p-channel transistors is formed from a semiconductor layer formed on said insulator film, and at least one electrode of each of said first and second capacitors is formed from an n-type region or a p-type region formed in said semiconductor layer.

7. A voltage generation circuit having first and second capacitors and generating a prescribed voltage through first and second nodes connected to first terminals of said first and second capacitors, respectively, said voltage generation circuit comprising:

a first n-channel transistor having one of a source terminal and a drain terminal connected to said first node with the other one of said source terminal and said drain terminal defining an output terminal outputting said prescribed voltage;

a second n-channel transistor having one of a source terminal and a drain terminal connected to said second node with the other one of said source terminal and said drain terminal defining an output terminal outputting said prescribed voltage;

a first p-channel transistor having one of a source terminal and a drain terminal connected to said first node with the other one of said source terminal and said drain terminal defining a reference potential terminal; and a second p-channel transistor having one of a source terminal and a drain terminal connected to said second node with the other one of said source terminal and said drain terminal defining a reference potential terminal, wherein a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on a glass substrate, an active layer of each of said first and second n-channel transistors and said first and second p-channel transistors is formed from a semiconductor layer formed on said glass substrate, and at least one electrode of each of said first and second capacitors is formed from an n-type region or a p-type region formed in said semiconductor layer.

8. A display unit comprising:

a plurality of display pixels arranged on intersections between a plurality of scan lines and a plurality of data lines in the form of a matrix;

a plurality of active switching elements provided for respective said display pixels for controlling a voltage applied to said display pixels;

a scan line driving circuit scanning said plurality of scan lines while applying a driving voltage for activating said plurality of active switching elements; and a voltage generation circuit outputting a prescribed voltage to said scan line driving circuit, wherein said voltage generation circuit has first and second capacitors and generates said prescribed voltage through first and second nodes connected to first terminals of said first and second capacitors, respectively, wherein said voltage generation circuit comprises:

a first n-channel transistor having one of a source terminal and a drain terminal connected to said first node with the other one of said source terminal and said drain terminal defining an output terminal outputting said prescribed voltage, a second n-channel transistor having one of a source terminal and a drain terminal connected to said second node with the other one of said source terminal and said drain terminal defining an output terminal outputting said prescribed voltage, a first p-channel transistor having one of a source terminal and a drain terminal connected to said first node with the other one of said source terminal and said drain terminal defining a reference potential terminal, and a second p-channel transistor having one of a source terminal and a drain terminal connected to said second node with the other one of said source terminal and said drain terminal defining a reference potential terminal, a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is applied to a second terminal of said second capacitor, wherein said voltage generation circuit is formed on a glass substrate, an active layer of each of said first and second n-channel transistors and said first and second p-channel transistors is formed from a semiconductor layer formed on said glass substrate, and at least one electrode of each of said first and second capacitors is formed from an n-type region or a p-type region formed in said semiconductor layer.

9. A display unit comprising:

a plurality of display pixels arranged on intersections between a plurality of scan lines and a plurality of data lines in the form of a matrix;

a plurality of active switching elements provided for respective said display pixels for controlling a voltage applied to said display pixels;

a scan line driving circuit scanning said plurality of scan lines while applying a driving voltage for activating said plurality of active switching elements; and a voltage generation circuit outputting a prescribed voltage to said scan line driving circuit, wherein said voltage generation circuit has first and second capacitors and generates said prescribed voltage through first and second nodes connected to first terminals of said first and second capacitors, respectively, wherein said voltage generation circuit comprises:

a first n-channel transistor having one of a source terminal and a drain terminal connected to said first node with the other one of said source terminal and said drain terminal defining an output terminal outputting said prescribed voltage, a second n-channel transistor having one of a source terminal and a drain terminal connected to said second node with the other one of said source terminal and said drain terminal defining an output terminal outputting said prescribed voltage, a first p-channel transistor having one of a source terminal and a drain terminal connected to said first node with the other one of said source terminal and said drain terminal defining a reference potential terminal, and a second p-channel transistor having one of a source terminal and a drain terminal connected to said second node with the other one of said source terminal and said drain terminal defining a reference potential terminal, a gate terminal of said first n-channel transistor and a gate terminal of said first p-channel transistor are connected in common and connected to said second node, a gate terminal of said second n-channel transistor and a gate terminal of said second p-channel transistor are connected in common and connected to said first node, said output terminals of said first and second n-channel transistors are connected in common, and one of two clock signals inverted in phase to each other is applied to a second terminal of said first capacitor and the other one of said two clock signals is apnlied to a second terminal of said second capacitor, wherein said voltage generation circuit further comprises a level conversion circuit stepping up/converting the levels of signals applied to said voltage generation circuit as said clock signals.

* * * * *